United States Patent
Takahashi

(10) Patent No.: US 10,418,301 B2
(45) Date of Patent: Sep. 17, 2019

(54) POWER DEVICE

(71) Applicant: Mitsubishi Electric Corporation, Tokyo (JP)

(72) Inventor: Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/963,293

(22) Filed: Apr. 26, 2018

(65) Prior Publication Data

US 2019/0027417 A1   Jan. 24, 2019

(30) Foreign Application Priority Data

Jul. 21, 2017  (JP) .................. 2017-141692

(51) Int. Cl.
| | |
|---|---|
| H01L 23/58 | (2006.01) |
| H01L 23/31 | (2006.01) |
| H01L 23/29 | (2006.01) |
| H01L 23/00 | (2006.01) |

(52) U.S. Cl.
CPC ........ *H01L 23/3192* (2013.01); *H01L 23/291* (2013.01); *H01L 24/29* (2013.01); *H01L 2924/1203* (2013.01); *H01L 2924/13055* (2013.01); *H01L 2924/13091* (2013.01); *H01L 2924/3512* (2013.01)

(58) Field of Classification Search
None
See application file for complete search history.

(56) References Cited

U.S. PATENT DOCUMENTS

| | | | | |
|---|---|---|---|---|
| 3,758,943 A | * | 9/1973 | Shibata | .................. H01L 21/00 |
| | | | | 257/758 |
| 6,753,596 B1 | * | 6/2004 | Nakajima | ........... H01L 23/4334 |
| | | | | 257/666 |
| 2014/0370665 A1 | * | 12/2014 | Rahimo | .................. H01L 29/45 |
| | | | | 438/135 |
| 2016/0126197 A1 | * | 5/2016 | Matoy | ............... H01L 23/49524 |
| | | | | 257/666 |

FOREIGN PATENT DOCUMENTS

| | | |
|---|---|---|
| JP | 3748849 B2 | 12/2005 |
| JP | 4738541 B2 | 5/2011 |
| JP | 6111907 B2 | 3/2017 |
| JP | 2017-069569 A | 4/2017 |

* cited by examiner

*Primary Examiner* — Calvin Y Choi
(74) *Attorney, Agent, or Firm* — Studebaker & Brackett PC

(57) ABSTRACT

A first metal layer is provided on a main surface side of a substrate. A second metal layer is formed on the first metal layer. A solder layer is provided on the second metal layer. An insulating member is structured so that an end of the first metal layer is partially connected to an end of the second metal layer.

12 Claims, 19 Drawing Sheets

F I G. 3
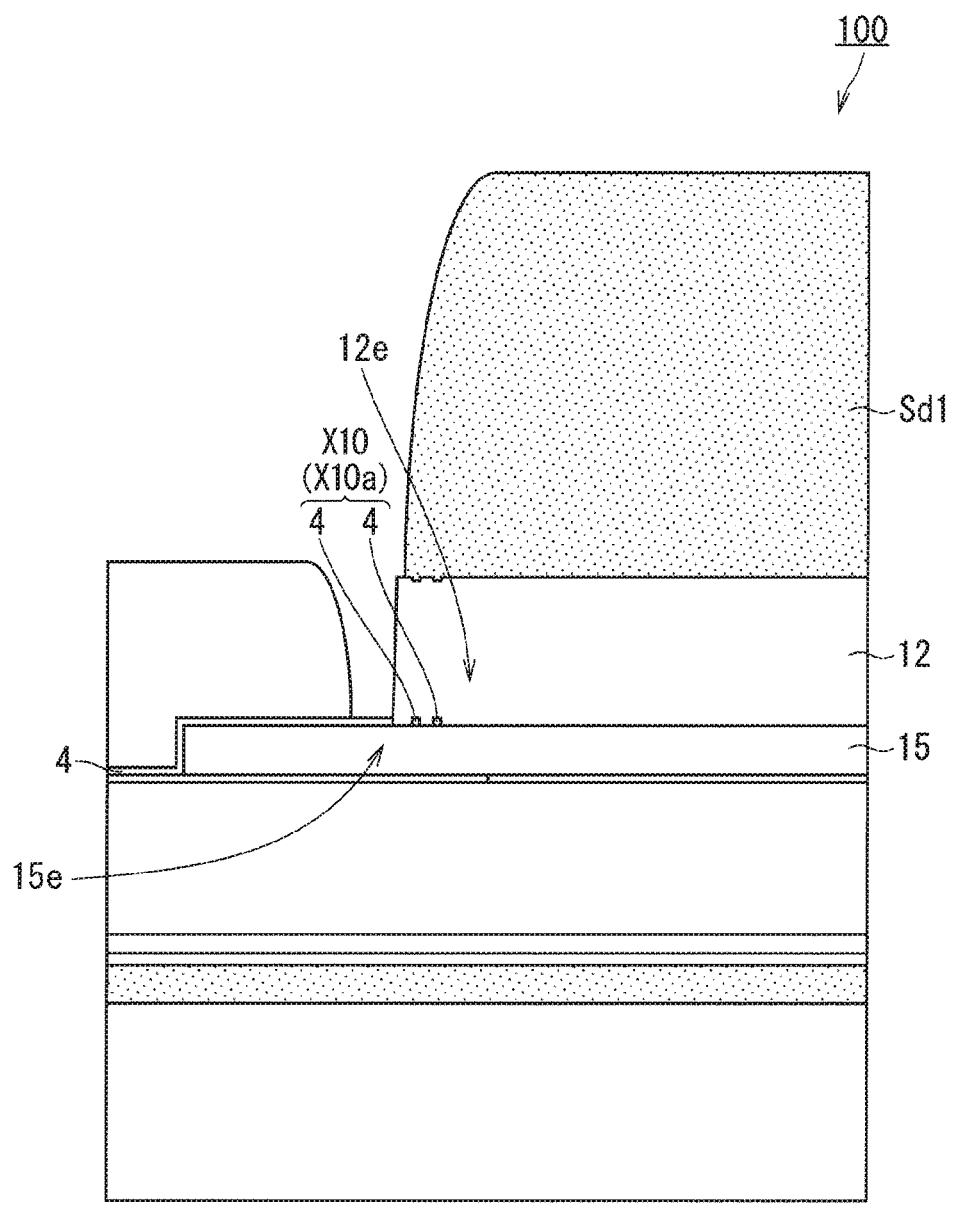

F I G. 1 1
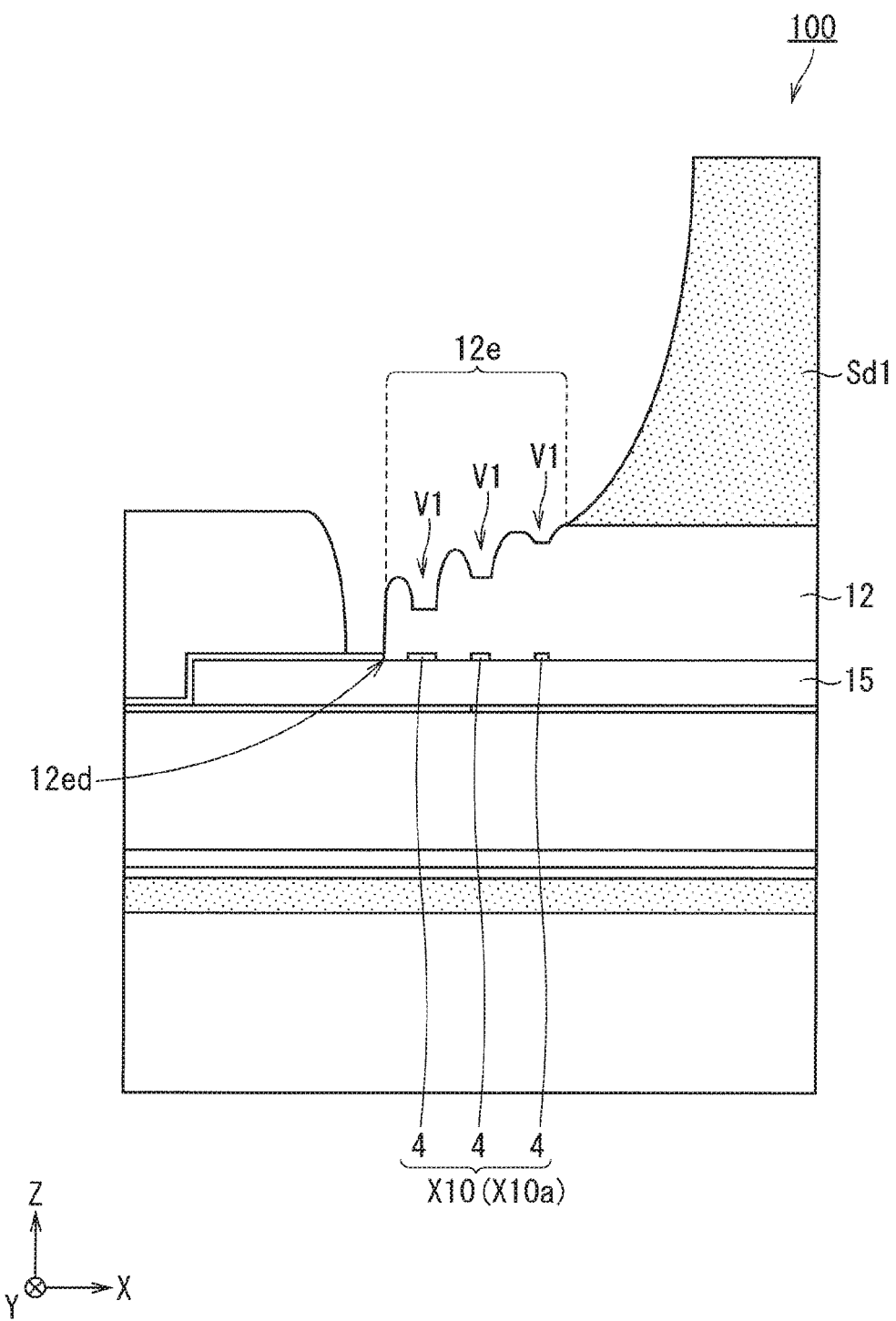

F I G. 1 5
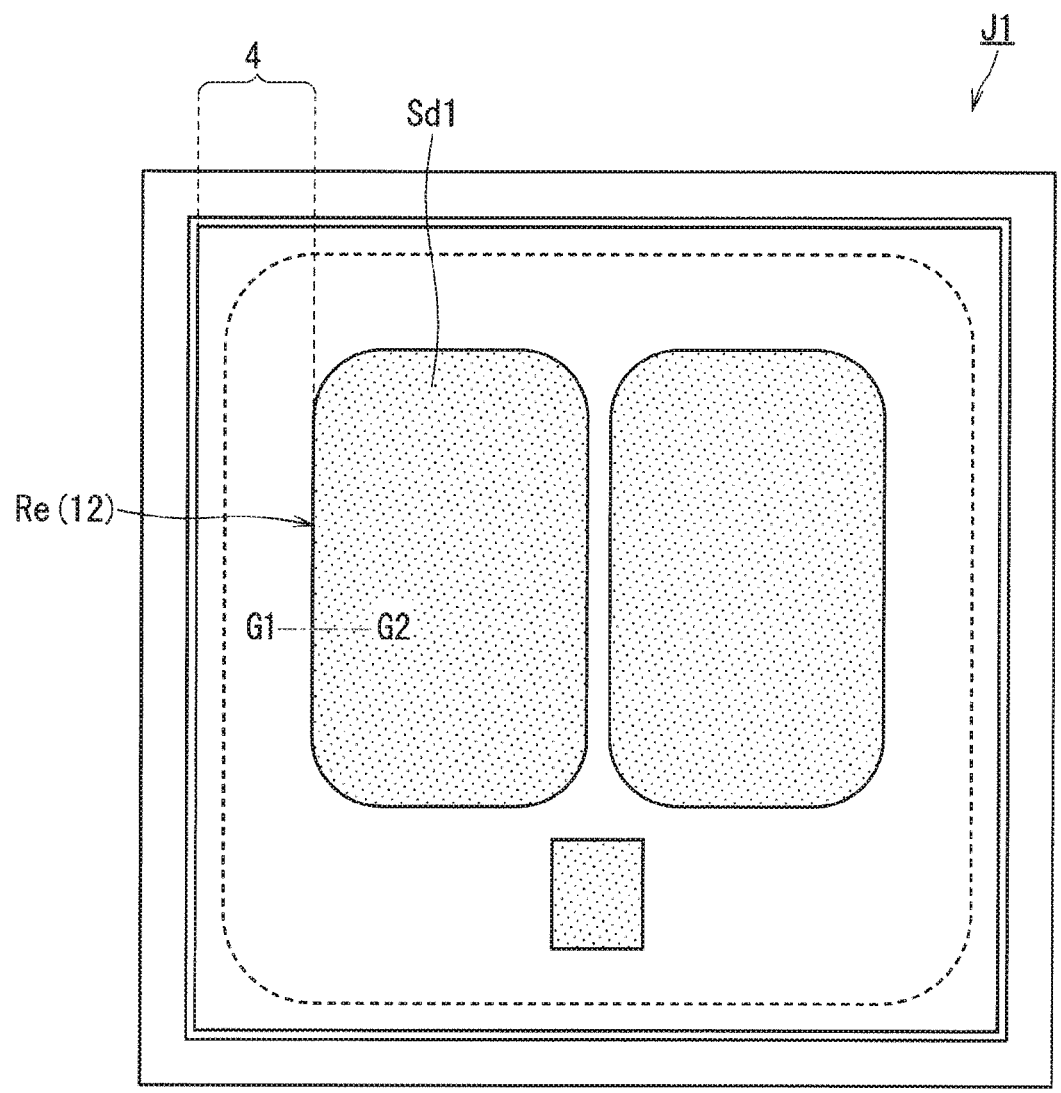

FIG. 18
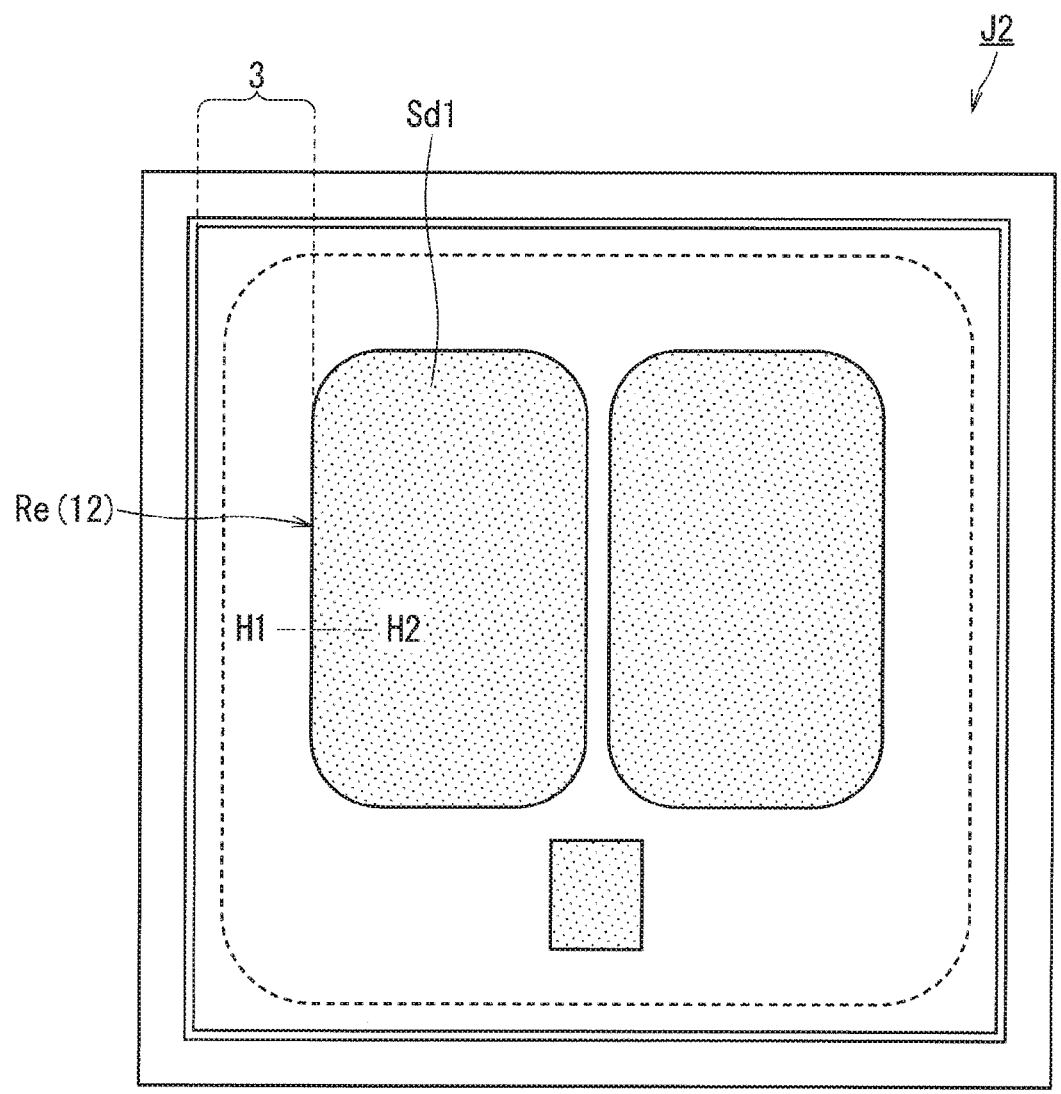
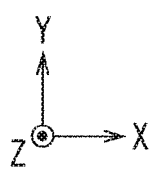

POWER DEVICE

BACKGROUND OF THE INVENTION

Field of the Invention

The present invention relates to a power device provided with electrodes on both surfaces of a substrate.

Description of the Background Art

What are demanded of a power device are small loss, a breakdown voltage holding capacity, a secured safe operation region, reliability and the like. The safe operation region refers to an operation region for a power device to avoid failure when the power device is in operation. The reliability refers to the property of withstanding long-period use. Note that, what is further demanded of the power device is to realize the foregoing plurality of characteristics at the lowest possible costs.

The criteria representing the reliability demanded of the power device are, for example, the heat cycle resistance, the power cycle resistance, and the like. The power device is used in various environments. Such a power device repeatedly performs a switching operation, for example, for causing high voltage and large current. In this case, with the power device, a low-temperature state and a high-temperature state repeatedly occur.

Note that, a power device is structured by a plurality of members. Accordingly, when the states described above occur, due to factors including the difference in coefficient of linear expansion between a plurality of members structuring the power device, large force may be applied to the joined portion of the plurality of members. For example, with a power device, metal fatigue may occur at a metal-joined portion, resulting in a breakage of the metal-joined portion. In this case, the function of the power device may stop. In view of the foregoing, a power device is designed to have durability corresponding to the product life.

A conventional power device often has the following structure in order to form a current path. In this structure, the lower surface electrode of the semiconductor element included in the power device is connected to a terminal via solder. Further, in this structure, the upper electrode of the semiconductor element is connected to other terminal by wire bonding using a wire made of aluminum or the like.

With the power device having the above-described structure, in some cases, the heat cycle occurs at the solder joined to the lower surface electrode of the semiconductor element, and the power cycle occurs at the joined portion between the upper electrode and the wire. In this case, metal fatigue may occur at the portion joined to the wire, thereby reducing or stopping the function of the semiconductor element.

In recent years, in order to increase the amount of current flowing through a power device, What is employed is the structure in which solder is joined to the upper surface electrode in place of the wire. Japanese Patent Application Laid-Open No. 2015-015395 discloses the structure in which solder is joined to a surface electrode of a semiconductor element, and the solder is connected to an external terminal (hereinafter also referred to as "Related Structure A").

In Related Structure A, the end of an additional electrode is joined to the surface electrode via a protective layer. Note that, the protective layer positioned between the end of the additional electrode and the surface electrode adheres to the end of the additional electrode and the surface electrode.

Accordingly, in Related Structure A, when force is applied to the end of the additional electrode joined to the solder, the force tends to be transferred to a substrate where a semiconductor element is formed, via the protective layer and the surface electrode. Accordingly, Related Structure A has a problem that, when large force is applied to the end of the additional electrode, the substrate may be broken by the force.

SUMMARY

An object of the present invention is to provide a power device capable of minimizing the chances of occurrence of a breakage of a substrate.

A power device according to one aspect of the present invention is a power device provided with a first main electrode on one main surface side of a substrate, and a second main electrode on other main surface side of the substrate. The power device includes a first metal layer provided on the one main surface side of the substrate and electrically connected to the one main surface, and a second metal layer formed on the first metal layer. The first main electrode includes the first metal layer and the second metal layer. A solder layer is provided on the second metal layer. The power device further includes an insulating member surrounded by a first end of the first metal layer and a second end of the second metal layer, the second end opposing to the first end. The insulating member is structured so that the first end of the first metal layer is partially connected to the second end of the second metal layer.

In the present invention, the first metal layer is provided on the one main surface side of the substrate. The insulating member is structured so that the first end of the first metal layer is partially connected to the second end of the second metal layer. That is, adhesion between the first end of the first metal layer and the second end of the second metal layer is low.

Accordingly, provided that large force is applied to the second end of the second metal layer where the solder layer is provided, at least part of the force is dispersed in the direction along the connection plane between the first end of the first metal layer and the second end of the second metal layer. As a result, the chances of large force being applied to the substrate are minimized. This minimizes the chances of occurrence of any breakage of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a section view of part of the power device having the structure according to a first variation of the present invention;

FIG. 11 is a section view of part of the power device having the structure according to the sixth variation of the present invention.

FIG. 15 is a plan view of a power device as Comparative Example;

FIG. 18 is a plan view of a power device as Other Comparative Example; and

DESCRIPTION OF THE PREFERRED EMBODIMENT

Figure 1:
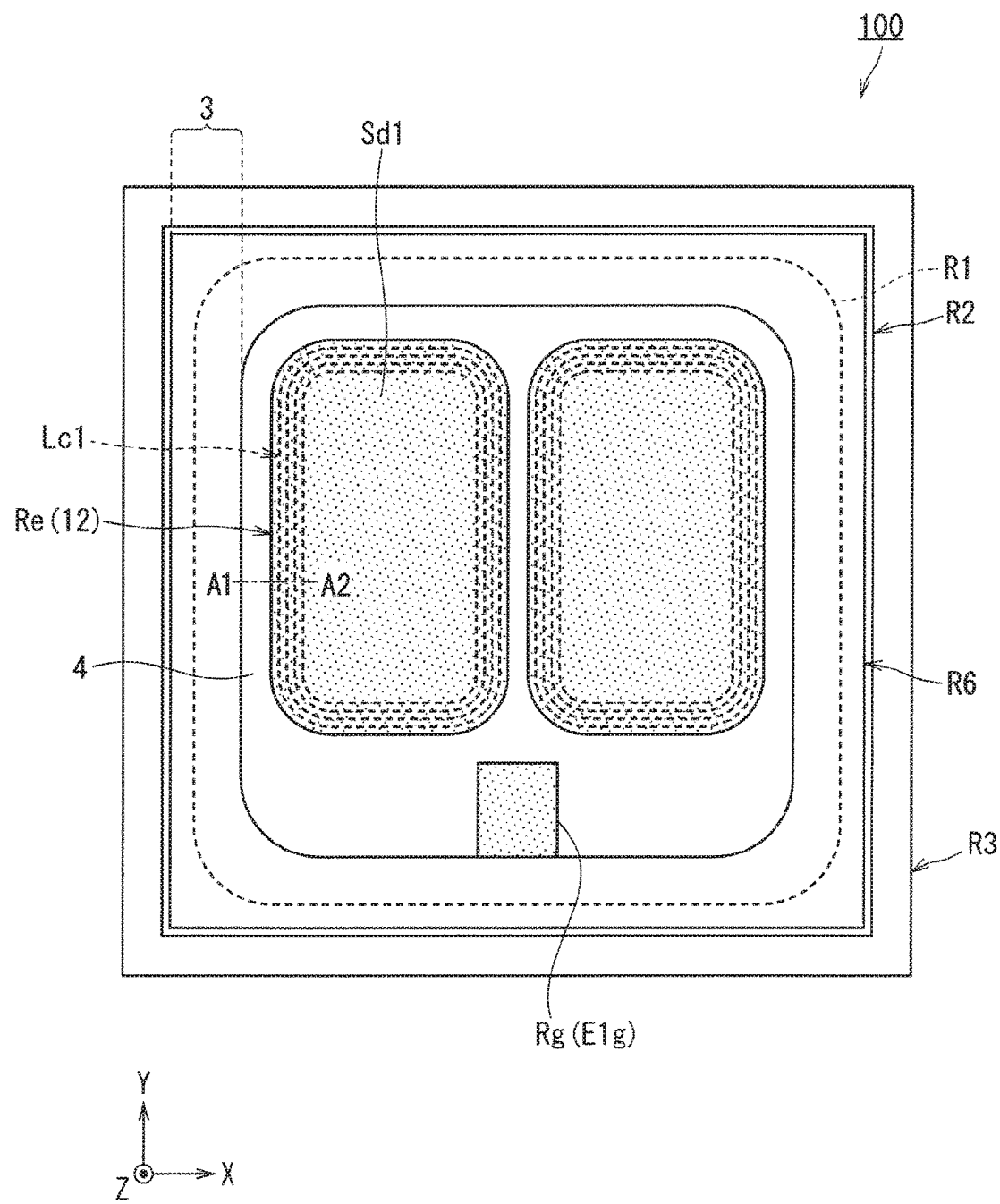
FIG. 1 is a plan view of a power device according to a first preferred embodiment of the present invention.

In the following, with reference to the drawings, a description will be given of a preferred embodiment of the present invention. In the drawings referred to in the following, an identical constituent is denoted by an identical reference character. The name and function of constituents denoted by an identical reference character are the same. Accordingly, a detailed description of part of the constituents denoted by an identical reference character may be omitted.

Note that, the dimension, material, shape, and relative disposition of constituents exemplarily shown in the preferred embodiment may be changed as appropriate according to the structure of a device to which the present invention is applied, various conditions and the like.

First Preferred Embodiment

FIG. 1 is a plan view of a power device 100 according to a first preferred embodiment of the present invention. In FIG. 1, X direction, Y direction, and Z direction are perpendicular to one another. In the subsequent drawings also, X direction, Y direction, and Z direction are perpendicular to one another. Hereinafter, a direction that includes X direction and a direction opposite to X direction (−X direction) is also referred to as "X-axis direction". Still further, hereinafter, a direction that includes Y direction and a direction opposite to Y direction (−Y direction) is also referred to as "Y-axis direction. Still further, hereinafter, a direction that includes Z direction and a direction opposite to Z direction (−Z direction) is also referred to as "Z-axis direction".

Further, hereinafter, a plane that includes X-axis direction and Y-axis direction is also referred to as "XY plane". Still further, hereinafter, a plane that includes X-axis direction and Z-axis direction is also referred to as "XZ plane". Still further, hereinafter, a plane that includes Y-axis direction and Z-axis direction is also referred to as "YZ plane".

Figure 2:
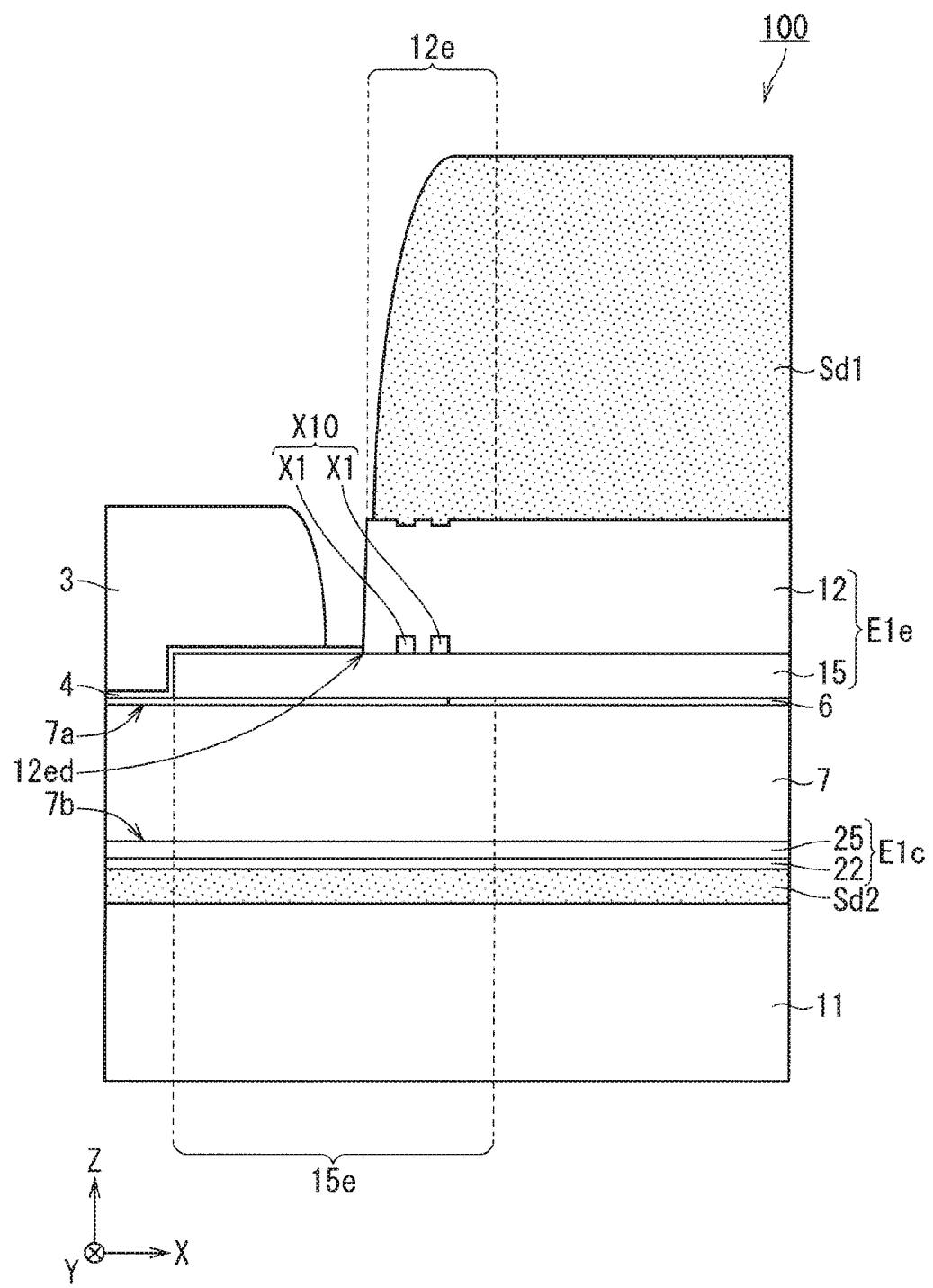
FIG. 2 is a section view of part of the power device according to the first preferred embodiment of the present invention.

FIG. 2 is a section view of part of a power device 100 taken along line A1-A2 in FIG. 1. With reference to FIGS. 1 and 2, the power device 100 includes an emitter electrode E1e being a main electrode, a gate electrode E1g, a collector electrode E1c being a main electrode, a substrate 7, a protective film 3, a glass coat film 4, a frame 11, solder layers Sd1, Sd2, and an insulating member X10.

The emitter electrode E1e is structured by metal layers 12, 15. That is, the emitter electrode E1e being a main electrode includes the metal layer 15 and the metal layer 12. The collector electrode E1c is structured by metal layers 22, 25.

As shown in FIG. 1, the power device 100 includes a supporting substrate region R3. The supporting substrate region R3 includes a dicing line region R2, and a breakdown voltage holding region R6. The dicing line region R2 includes a chip region R1. The chip region R1 corresponds to part of the supporting substrate region R3.

The chip region R1 includes an emitter electrode region Re and a gate electrode region Rg. The emitter electrode region Re is a region where the emitter electrode E1e is disposed. Note that, in FIG. 1, at the emitter electrode region Re, the contour of the metal layer 12 being part of the emitter electrode E1e is shown.

The emitter electrode E1e (the metal layer 12) is joined to the solder layer Sd1. The shape of the solder layer Sd1 as seen in a plan view (XY plane) is substantially quadrangular. In the gate electrode region Rg, the gate electrode E1g is disposed.

The substrate 7 is a Si substrate made of silicon. The substrate 7 includes a main surface 7a and a main surface 7b. On the main surface 7a side of the substrate 7, the emitter electrode E1e being a main electrode is provided. On the main surface 7b side of the substrate 7, the collector electrode E1c being a main electrode is provided.

Each of the metal layers 15, 25 is made of aluminum alloy (AlSi). The metal layer 25 is provided at the main surface 7b of the substrate 7. Each of the metal layers 12, 22 is made of Ni (nickel). Note that, the metal layers 15, 25 are lower in hardness than the metal layers 12, 22. The metal layer 22 is formed at the lower surface of the metal layer 25. The metal layer 22 is joined to the frame 11 via the solder layer Sd2.

The metal layer 15 is provided on the main surface 7a side of the substrate 7. The shape of the metal layer 15 as seen in a plan view (XY plane) is substantially quadrangular. The metal layer 15 is electrically connected to the main surface 7a via a conductive contact part 6.

The glass coat film 4 is provided on the main surface 7a side of the substrate 7. The glass coat film 4 is provided so as to cover part of the main surface 7a of the substrate 7 and part of the metal layer 15. The glass coat file 4 functions as a passivation film. The region where the glass coat film 4 exists functions as the breakdown voltage holding region R6.

As shown in FIG. 2, the protective film 3 is provided on the glass coat film 4. The protective film 3 is made of polyimide.

The metal layer 12 is formed on the metal layer 15. The shape of the metal layer 12 as seen in a plan view (XY plane) substantially quadrangular. On the metal layer 12, the solder layer Sd1 is provided.

Note that, at the substrate 7 positioned below part of the metal layer 15, a semiconductor element is formed. The semiconductor element is, for example, an IGBT (Insulated Gate Bipolar Transistor), a MOSFET (Metal-Oxide-Semiconductor Field-Effect Transistor), a diode or the like.

Characteristic Structure

Next, a description will be given of the characteristic structure (hereinafter also referred to as "Structure Ct1") of the present invention. Structure Ct1 is a structure employing the insulating member X10.

At the boundary between an end 12e of the metal layer 12 and an end 15e of the metal layer 15, the insulating member X10 is independently formed. The insulating member X10 is made of a material being less adhesive to the metal layer 12 (Ni). Note that, the insulating member X10 is smaller in thickness than the metal layer 12. Further, the metal layer 15 and the metal layer 12 are structured so as to surround the insulating member X10. Specifically, the insulating member X10 is surrounded by the end 15e of the metal layer 15 and the end 12e of the metal layer 12. The end 12e opposes to the end 15e. Specifically, the end 12e opposes to part of the end 15e.

Further, the insulating member X10 is structured so that the end 15e of the metal layer 15 is partially connected to the end 12e of the metal layer 12. Specifically, as shown in FIG. 1, as seen in a plan view (XY plane), the insulating member X10 is provided along the rim part of the solder layer Sd1. The insulating member X10 is structured by a plurality of insulating films X1 being different from each other in size.

As an example, the insulating member X10 is structured by two insulating films X1. In FIG. 1, broken lines Lc1 represent the contours of the two insulating films X1. The shape of each of the plurality of insulating films X1 is ring-like (closed loop-like). Note that, the number of the insulating film X1 structuring the insulating member X10 may be one or three or more.

The manufacturing method of the power device 100 according to the first preferred embodiment is a method employing a general technique for manufacturing a semiconductor element (deposition, lithography, etching or the like). Accordingly, a detailed description of the manufacturing method is omitted. A brief description is given in the following.

As described above, the thickness of the insulating member X10 is smaller than the thickness of the metal layer 12. Accordingly, in the course of increasing the thickness of Ni by electroless plating or the like, at a time point where the thickness of Ni exceeds the thickness of the insulating member X10, Ni starts to grow in the lateral direction. Thus, the insulating member X10 is formed so that the entire insulating member X10 is surrounded by the metal layer 12 and the metal layer 15.

As has been described above, according to the present preferred embodiment, the metal layer 15 is provided on the main surface 7a side of the substrate 7. The insulating member X10 is structured so that the end 15e of the metal layer 15 is partially connected to the end 12e of the metal layer 12. That is, adhesion between the end 15e of the metal layer 15 and the end 12e of the metal layer 12 is small.

Accordingly, provided that large force is applied to the end 12e of the metal layer 12 where the solder layer Sd1 is provided, at least part of the force is dispersed in the direction along the connection plane between the end 15e of the metal layer 15 and the end 12e of the metal layer 12. As a result, the chances of large force being applied to the substrate 7 are minimized. Consequently, the chances of occurrence of any breakage of the substrate 7 are minimized. Further, the chances of large force being applied to the substrate 7 while the temperature of the solder layer Sd1 is varying are minimized.

Figure 16:
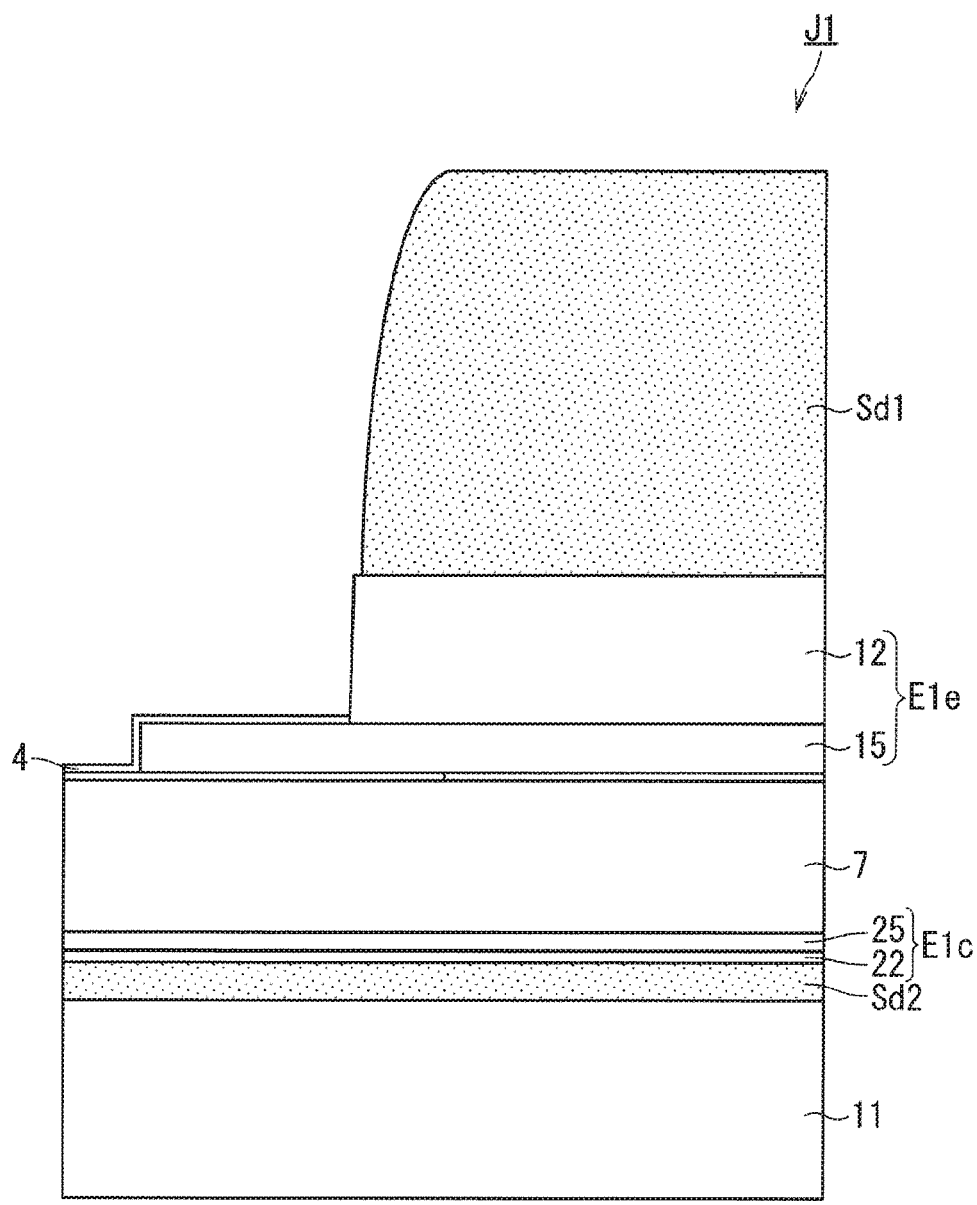
FIG. 16 is a section view of part of the power device as Comparative Example.

Here, a description will be given of Comparative Example being the comparison target of the present preferred embodiment. Hereinafter, a power device as Comparative Example is also referred to as the "power device J1". FIG. 15 is a plan view of the power device J1 as Comparative Example. FIG. 16 is a section view of part of the power device J1 as Comparative Example taken along line G1-G2 in FIG. 15.

The power device J1 is different from the power device 100 in not including the insulating member X10 and the protective film 3. The rest of the structure of the power device J1 is similar to that of the power device 100 and, therefore, a detailed description thereof will not be repeatedly provided.

In the structure of the power device J1, the solder layer Sd1 is bonded to the main electrode (the emitter electrode E1e). This allows an increase in the current amount flowing through the power device J1. However, the power device J1 has a problem in low heat cycle resistance. This problem will be described with reference to FIG. 17.

Figure 17:
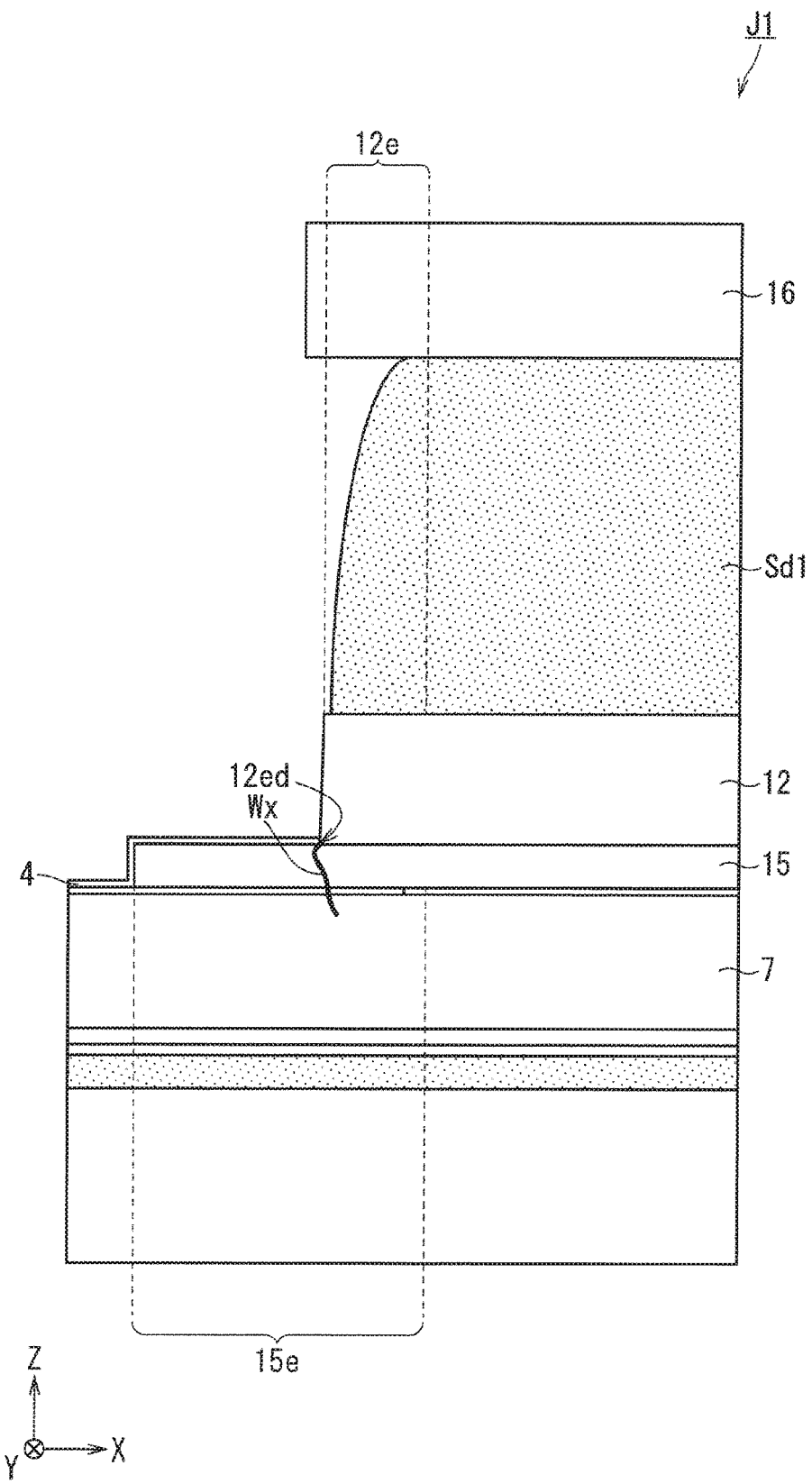
FIG. 17 is an illustration for describing problem related to the heat cycle.

FIG. 17 is a diagram for describing the problem related to the heat cycle. In order to describe the problem, FIG. 17 shows the state where a frame 16 is joined to the solder layer Sd1.

As described above, the hardness of the metal layer 15 is lower than the hardness of the metal layer 12. When the frame 16 expands or contracts due to variations in temperature or the like, force is applied to the solder layer Sd1. When the force applied to the solder layer Sd1 is great, an edge 12ed of the metal layer 12 may invite occurrence of a crack Wx as shown in FIG. 17 at the end 15c of the metal layer 15. In particular, when the force in the vertical direction is great, the crack Wx may occur also at the substrate 7. Occurrence of the crack at the substrate 7 poses a problem that the power device J1 becomes incapable of driving.

Further, when the semiconductor element included in the power device J1 enters ON state, by the following phenomenon, force along both or one of the vertical direction and the horizontal direction is applied to the end 12e of the metal layer 12. The phenomenon is, for example, existence of the difference between the coefficient of linear expansion of the solder layer Sd1 and the coefficient of linear expansion of the frame 16. Further, the phenomenon is, for example, occurrence of contraction or expansion of the solder layer Sd1 due to variations in temperature of the solder layer Sd1. When the solder layer Sd1, the metal layer 12 or the like contracts, force that separates the end 12e of the metal layer 12 from the metal layer 15 occurs at the metal layer 12.

Further, when adhesion between the metal layer 12 and the metal layer 15 is great, force is applied to the metal layer 15 which, as described above, invites the problem of occurrence of a crack at the metal layer 15.

Figure 19:
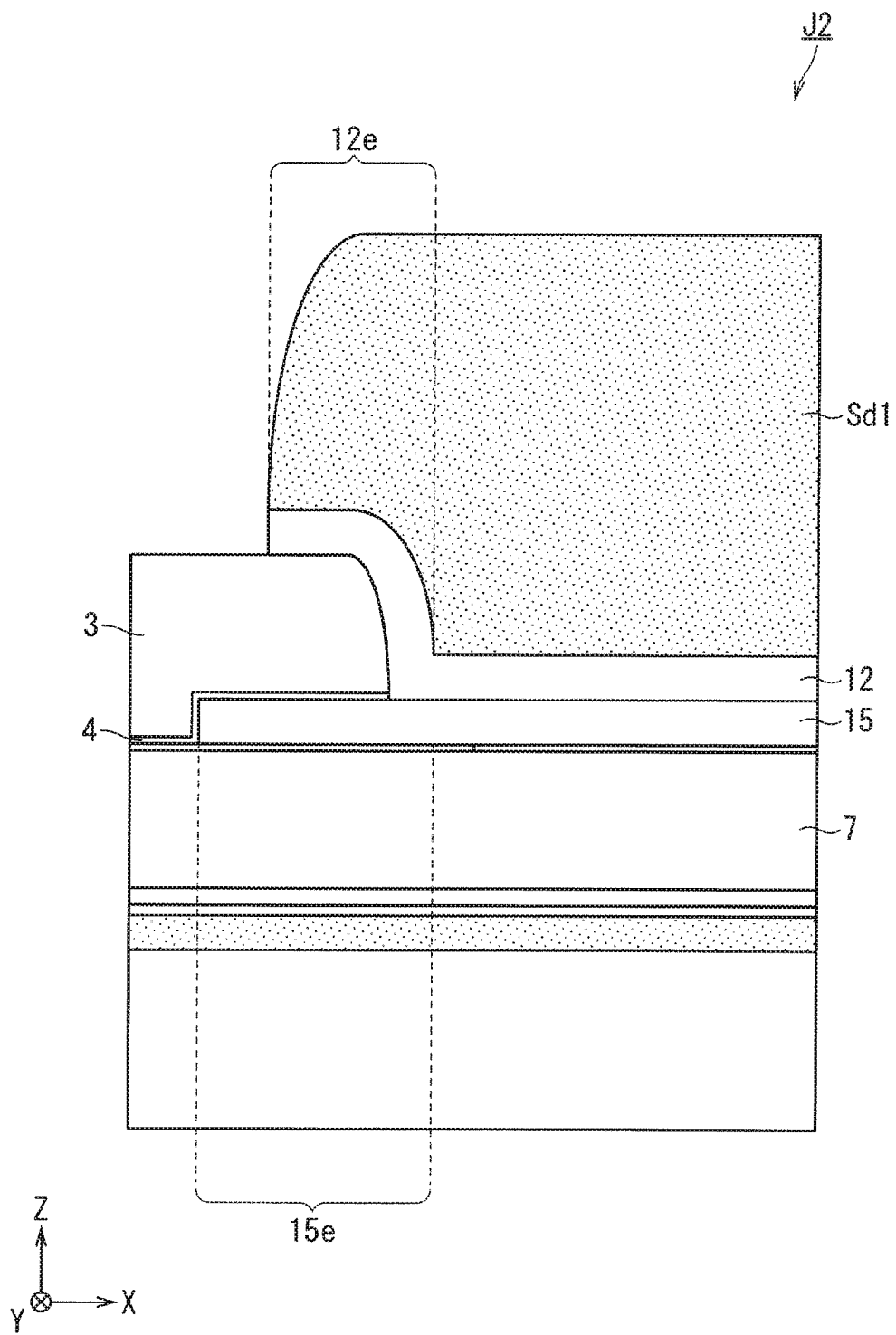
FIG. 19 is a section view of part of the power device as Other Comparative Example.

In order to solve the problem, Other Comparative Example may be contemplated. Hereinafter, a power device as Other Comparative Example is also referred to as the "power device J2". FIG. 18 is a plan view of the power device J2 as Other Comparative Example. FIG. 19 is a section view of part of the power device J2 as Other Comparative Example taken along line H1-H2 in FIG. 18.

With reference to FIGS. 18 and 19, the power device J2 is different from the power device J1 in further including the protective film 3. The rest of the structure of the power device J2 is similar to that of the power device J1 and, therefore, a detailed description thereof will not be repeatedly provided.

With reference to FIG. 19, in the power device J2, the protective film 3 is provided between the end 12e of the metal layer 12 and the end 15e of the metal layer 15. Further, the metal layer 12 is structured so that the end 12e of the metal layer 12 climbs on the upper surface of the protective film 3. This reduces the stress occurring at the edge of the metal layer 12 due to thermal deformation of the metal layer 12, the solder layer Sd1 or the like.

That is, with the power device J2, the thickness of the protective film 3 must be increased in order to reduce the stress. Further, the metal layer 12 must be structured so that the end 12e of the metal layer 12 climbs on the upper surface of the protective film 3. In the manufacturing method employing plating, in order to achieve the above-described climbing structure, the thickness of the metal layer 12 must be smaller than the thickness of the protective film 3. In this case, there exists a problem that thermal deformation of the metal layer 12 tends to occur.

Employing sputtering, it is possible to attain the climbing structure by reducing the thickness of the metal layer 12 to be smaller than the thickness of the protective film 3. However, with sputtering, it is necessary to use a technique such as special masking. Accordingly, employing sputtering invites a problem of high manufacturing cost.

In view of the foregoing, the power device 100 according to the present preferred embodiment has the above-described structure. Accordingly, the power device 100 according to the present preferred embodiment can solve the above-described problems.

In the present preferred embodiment, as described above, the insulating member X10 is structured so that the end 15e of the metal layer 15 is partially connected to the end 12e of the metal layer 12. That is, adhesion between the end 15e of the metal layer 15 and the end 12e of the metal layer 12 is low.

Accordingly, provided that force separating the end 12e from the end 15e of the metal layer 15 has occurred at the metal layer 12, the present preferred embodiment reduces the average force applied to the end 15e of the metal layer 15. Further, the present preferred embodiment improves the heat cycle resistance and the power cycle resistance of the power device 100.

Further, by the insulating member X10 being provided at the proper position, provided that a crack starting from the metal layer 15 toward the substrate 7 has occurred at the end 15e of the metal layer 15, the end 12e of the metal layer 12 is separated from the end 15e of the metal layer 15 before the crack occurs at the substrate 7. For example, the separating portion (a crack) between the end 12e of the metal layer 12 and the metal layer 15 shifts along the horizontal direction. Thus, the Structure Ct1 of the present preferred embodiment minimizes the chances of occurrence of a breakage (a crack) at the substrate 7.

Further, the insulating member X10 is structured by a plurality of insulating films X1 being ring-like. Accordingly, the speed of the separating portion (a crack) shifting along the horizontal direction can be controlled.

First Variation

Hereinafter, the structure of the present variation is also referred to as "Structure Ctm1". In Structure Ctm1, the insulating member X10 is structured by a glass coat film. Structure Ctm1 is applied to Structure Ct1 (the first preferred embodiment).

FIG. 1 is a plan view of the power device 100 having Structure Ctm1 according to the first variation of the present invention, FIG. 3 is a section view of part of the power device 100 having Structure Ctm1 taken along line A1-A2 in FIG. 1.

Structure Ctm1 is different from Structure Ct1 shown in FIG. 2 just in that the insulating member X10 is structured by the glass coat film 4 in place of the insulating film X1. The rest of the structure of Structure Ctm1 is similar to that of Structure Ct1 and, therefore, a detailed description thereof will not be repeatedly provided. Note that, in Structure Ctm1, as seen in a plan view (XY plane), the insulating member X10 is provided along the rim part of the solder layer Sd1.

The shape and structure of the glass coat film 4 are similar to those of the insulating film X1. The glass coat film 4 is also an insulating film. In Structure Ctm1, the insulating member X10 is structured by a plurality of glass coat films 4 (insulating films) being different from each other in size.

Hereinafter, the insulating member X10 structured by one or more glass coat films 4 (insulating films) is referred to also as the "insulating member X10a". As an example, the insulating member X10a is structured by two glass coat films 4 (insulating films). The shape of each of the plurality of glass coat films 4 (the insulating films) ring-like (closed loop-like).

Further, each of the glass coat films 4 (the insulating films) is, as an example, an oxide film. That is, in Structure Ctm1, the insulating member X10a structured by a plurality of glass coat films 4 is structured by oxide films.

Note that, the glass coat films 4 (the insulating films) may be, as an example, nitride films. In this case, in Structure Ctm1, the insulating member X10a structured by the plurality of glass coat films 4 is structured by nitride films.

The plurality of glass coat films 4 (the insulating films) structuring the insulating member X10a (X10) are formed as follows. Firstly, by deposition or the like, a glass coat is deposited. Thereafter, by patterning using the lithography technique, the glass coat film 4 as a passivation film and a plurality of glass coat films 4 structuring the insulating member X10 are simultaneously formed.

As has been described above, the present variation exhibits the effect identical to that exhibited by the first preferred embodiment. Further, since the plurality of glass coat films 4 structuring the insulating member X10a (X10) and the glass coat film 4 as a passivation film are simultaneously formed, the manufacturing cost of the power device reduces.

Second Variation

Hereinafter, the structure of the present variation is also referred to as "Structure Ctm2". In Structure Ctm2, the insulating member X10 is structured by a plurality of insulating parts w1 disposed dot-like (point-like). The insulating parts w1 are made of, for example, a material similar to that structuring the glass coat film 4. Structure Ctm2 applies to all or part of Structure Ct1 (the first preferred embodiment) and Structure Ctm1 (the first variation).

Figure 4:
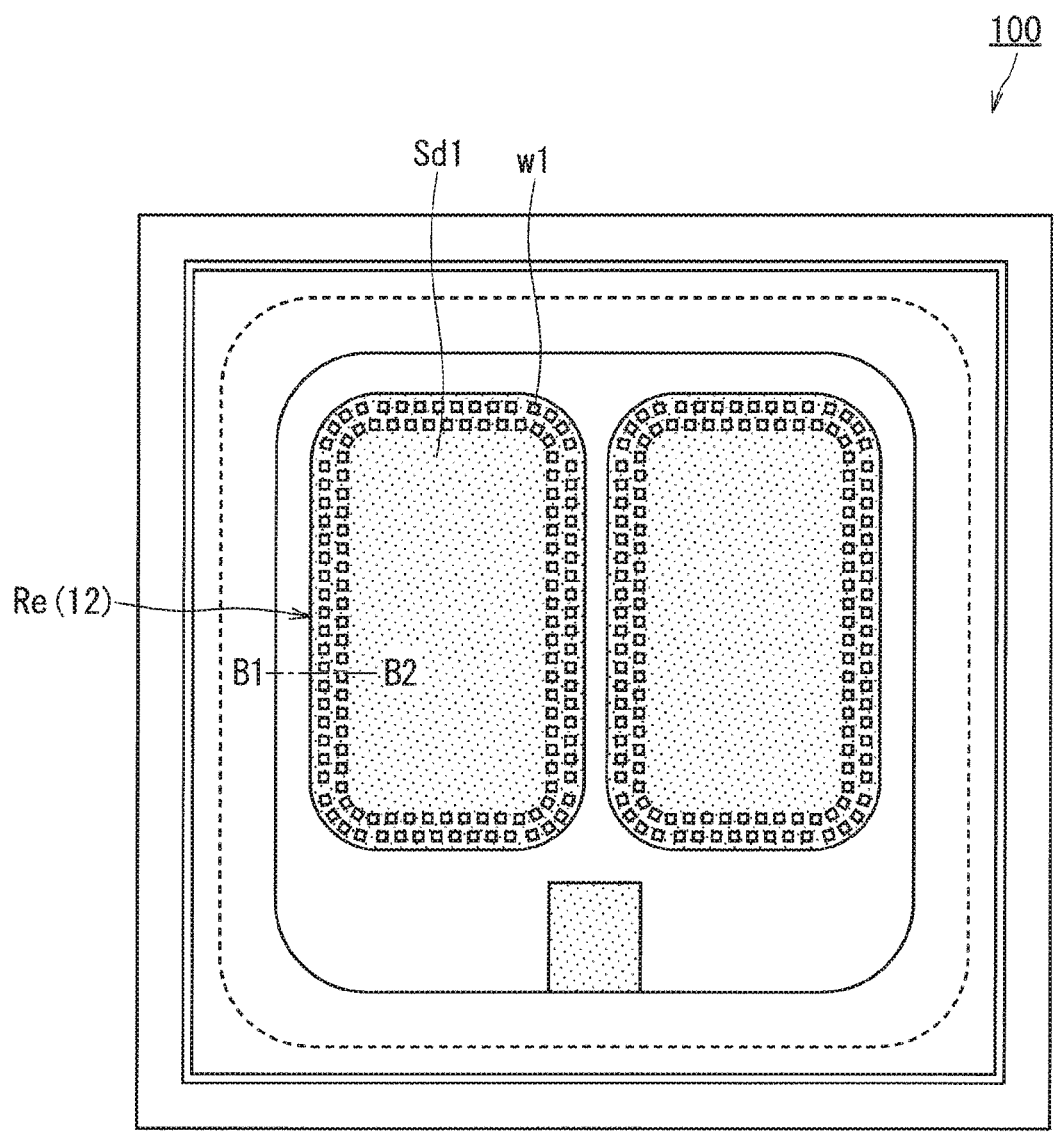
FIG. 4 is a plan view of a power device having the structure according to a second variation of the present invention.

FIG. 4 is a plan view of the power device 100 having Structure Ctm2 according to the second variation of the present invention. In the following, Structure Ct1 (the first preferred embodiment) to which Structure Ctm2 is applied is also referred to as "Structure Ct1m2". Note that, FIG. 2 is a section view of part of the power device 100 having Structure Ct1m2 taken along line B1-B2 in FIG. 4.

In Structure Ct1m2, each of the plurality of insulating films X1 structuring the insulating member X10 is formed by a plurality of insulating parts w1 disposed dot-like (point-like). That is, in Structure Ct1m2, the insulating member X10 is structured by the plurality of insulating parts w1 disposed dot-like (point-like).

Further, hereinafter, Structure Ctm1 (the first variation) to which Structure Ctm2 is applied is also referred to as "Structure Ctm12". Note that, FIG. 3 is a section view of part of the power device 100 having Structure Ctm12 taken along line B1-B2 in FIG. 4.

In Structure Ctm12, each of a plurality of glass coat films 4 (the insulating films) structuring the insulating member X10 is structured by a plurality of insulating parts w1 disposed dot-like (point-like). That is, in Structure Ctm12, the insulating member X10 is structured by a plurality of insulating parts w1 disposed dot-like (point-like).

As has been described above, the present variation exhibits the effect identical to that exhibited by the first preferred embodiment. Further, since the insulating member X10 is structured by the plurality of insulating parts w1 disposed dot-like (point-like), adhesion between the end 12e of the metal layer 12 and the end 15e of the metal layer 15 can be two-dimensionally averaged. Further, average adhesion between the end 12e of the metal layer 12 and the end 15e of the metal layer 15 can be leveled. Accordingly, the chances of occurrence of local concentration of the stress at the end 15e of the metal layer 15 are minimized.

Third Variation

Hereinafter, the structure of the present variation is also referred to as "Structure Ctm3". In Structure Ctm3, the shape of the solder layer Sd1 on its side surface side is fillet-shaped. That is, a fillet Ft is formed at the side surface of the solder layer Sd1.

Structure Ctm3 is applied to all or part of Structure Ct1 (the first preferred embodiment), Structure Ctm1 (the first variation), and Structure Ctm2 (the second variation).

As an example, Structure Ctm12 to which Structure Ctm3 is applied (hereinafter referred to also as the "Structure Ctm123") is described in the following. Structure Ctm123 is obtained by applying Structure Ctm3 to the structure shown in FIG. 3.

Figure 5:
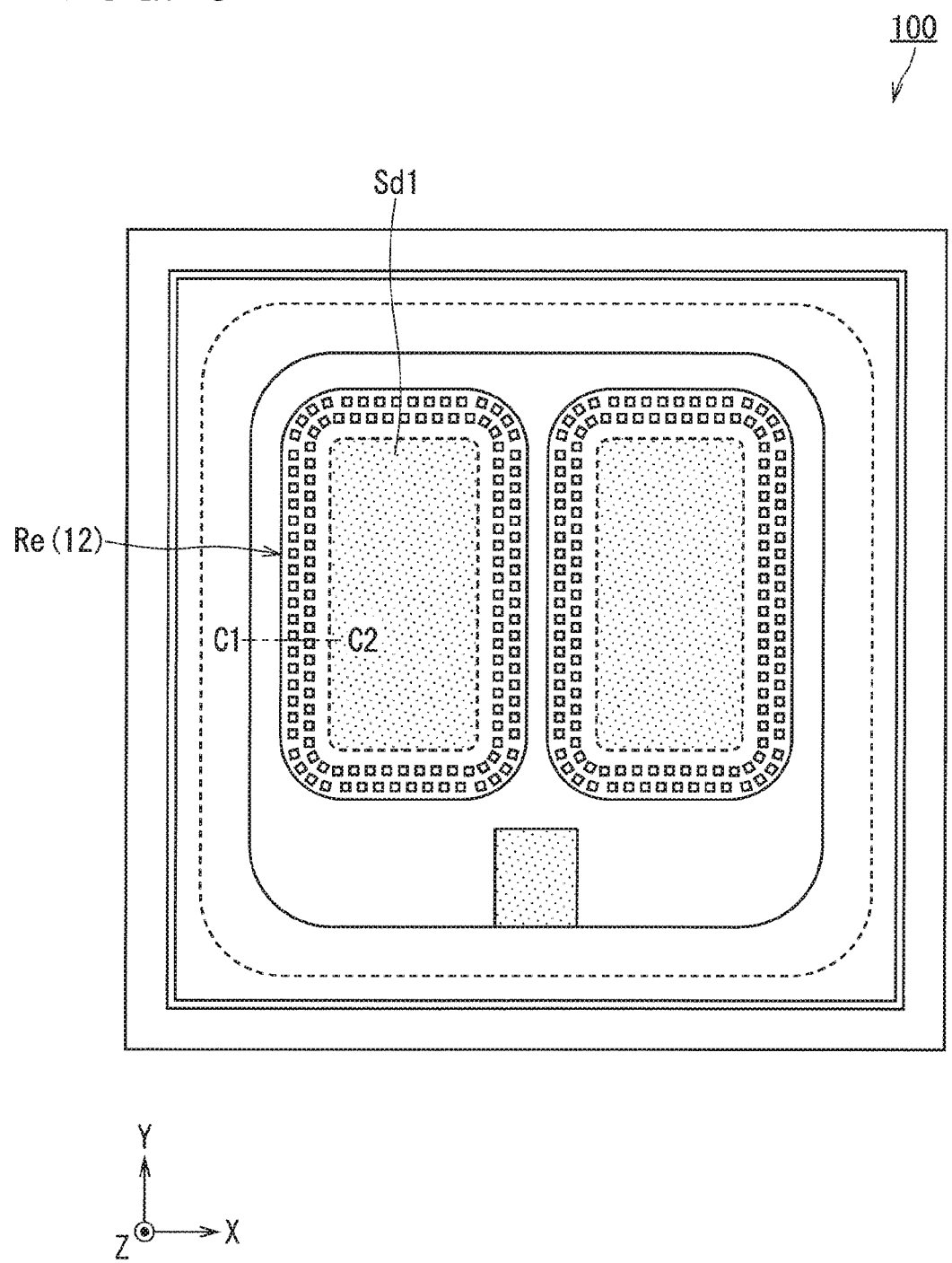
FIG. 5 is a plan view of a power device having the structure according to a third variation of the present invention.
Figure 6:
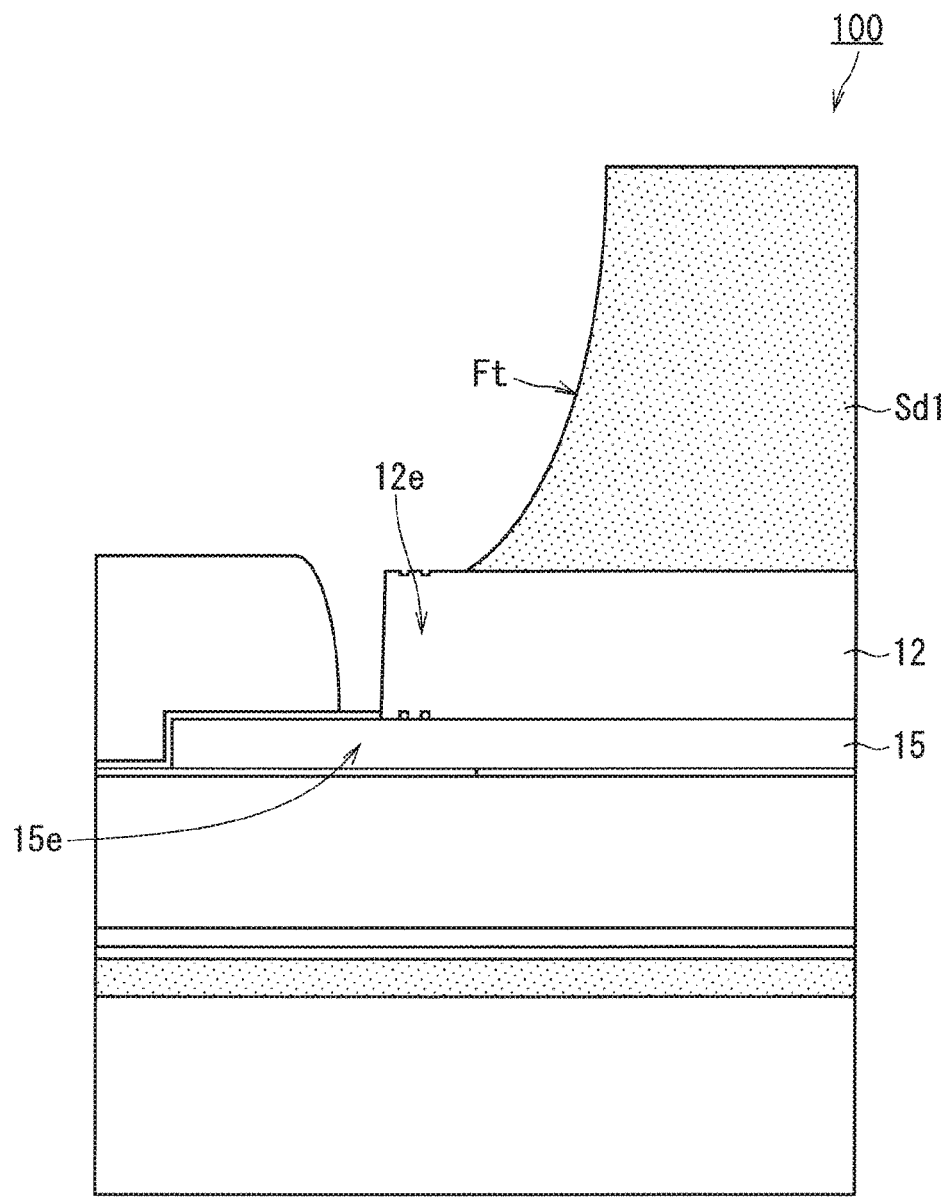
FIG. 6 is a section view of a power device having e structure according to the third variation of the present invention.

FIG. 5 is a plan view of the power device 100 having Structure Ctm123 according to the third variation of the present invention. FIG. 6 is a section view of part of the power device 100 having Structure Ctm123 according to the third variation of the present invention taken along line C1-C2 in FIG. 5. As shown in FIG. 6, the shape of the solder layer Sd1 on its side surface side is fillet-shaped. That is, the fillet Ft is formed at the side surface of the solder layer Sd1.

As has been described above, the present variation exhibits the effect identical to that exhibited by the first preferred embodiment. Further, with Structure Ctm123, the present variation exhibits the effect identical to that exhibited by the second variation.

Further, by virtue of the shape of the solder layer Sd1 on the side surface side being fillet-shaped (the shape spreading downward), force applied to the end 12e of the metal layer 12 reduces. Accordingly, the chances of occurrence of separation (a crack) between the end 12e of the metal layer 12 and the metal layer 15 are minimized. Consequently, the heat cycle resistance of the power device 100 improves. As a result, the product life of the power device 100 extends.

Fourth Variation

Hereinafter, the structure of the present variation is also referred to as "Structure Ctm4". In Structure Ctm4, the power device 100 further includes a Ti layer 5. Further, in Structure Ctm4, the insulating member X10 is provided on the Ti layer 5. That is, in Structure Ctm4, the Ti layer 5 exists under the insulating member X10. The Ti layer 5 is made of Ti (titanium).

Structure Ctm4 is applied to all or part of Structure Ct1 (the first preferred embodiment), Structure Ctm1 (the first variation), Structure Ct2 (the second variation), and Structure Ctm3 (the third variation).

As an example, Structure Ctm123 to which Structure Ctm4 is applied (hereinafter also referred to as "Structure Ctm1234") is described in the following. Structure Ctm1234 is obtained by applying Structure Ctm4 to the structure shown in FIGS. 5 and 6.

Figure 7:
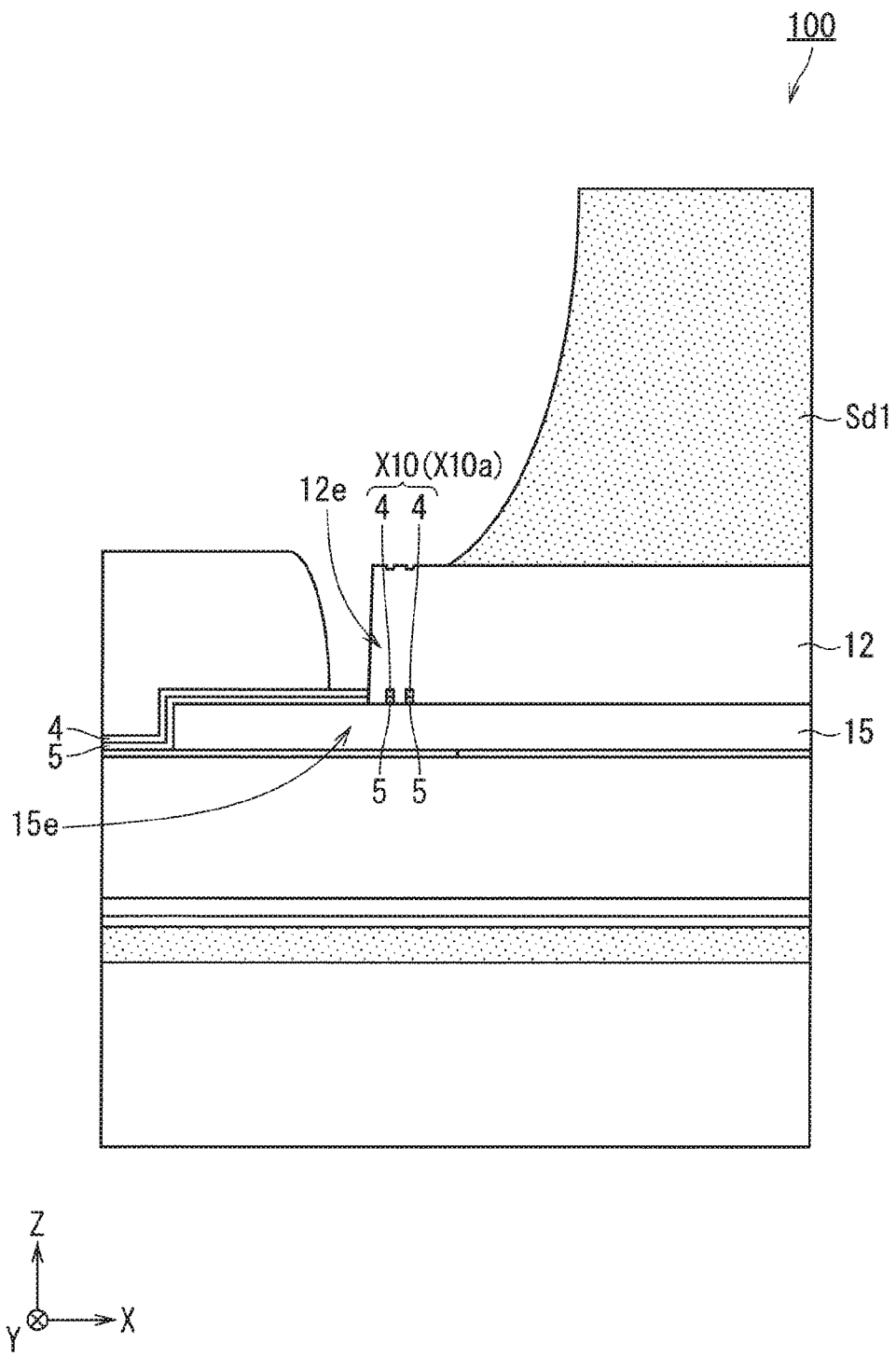
FIG. 7 is a section view of part of a power device having the structure according to a fourth variation of the present invention.

FIG. 5 is a plan view of the power device 100 having Structure Ctm1234. FIG. 7 is a section view of part of the power device 100 having Structure Ctm1234 according to the fourth variation taken along line C1-C2 in FIG. 5. With reference to FIG. 7, in Structure Ctm1234, the insulating member X10 is provided on the Ti layer 5. That is, under each of the glass coat films 4 (the insulating films) structuring the insulating member X10, the Ti layer 5 exists.

The Ti layer 5 is formed as follows. Firstly, on the metal layer 15, the Ti layer 5 is formed by sputtering. Thereafter, the insulating member X10 is formed on the Ti layer 5 by a general technique for manufacturing a semiconductor element (deposition, lithography, etching or the like).

As has been described above, the present variation exhibits the effect identical to that exhibited by the first preferred embodiment. Further, Structure Ctm1234 exhibits the effect identical to that exhibited by the second and third variations.

Further, in Structure Ctm1234, the Ti layer 5 exists under each of the glass coat films 4 (the insulating films). Accordingly, provided that the pattern is lost at one of the glass coat film 4 and the Ti layer 5, the state where adhesion between the end 12e of the metal layer 12 and the end 15e of the metal layer 15 is low is maintained.

Further, by virtue of the presence of the Ti layer 5 on the metal layer 15 made of AlSi, the effect of AR (Anti-Reflective) coating is exhibited on the metal layer 15. Thus, in patterning the metal layer 15 using resist by lithography, the chances of occurrence of variations in dimension of the opening of the resist due to halation are minimized.

Still further, by virtue of the presence of the Ti layer 5 under the glass coat films 4 (the insulating films), controllability over the dimension in photo fabricating Al improves.

Fifth Variation

Hereinafter, the structure of the present variation is also referred to as "Structure Ctm5". In Structure Ctm5, in the end 12e of the metal layer 12, a recess V1 is formed at a region above the insulating member X10.

Structure Ctm5 is applied to all or part of Structure Ct1 (the first preferred embodiment), Structure Ctm1 (the first variation), Structure Ctm2 (the second variation), Structure Ctm3 (the third variation), and Structure Ctm4 (the fourth variation).

As an example, Structure Ctm1, Ctm3 to which Structure Ctm5 is applied (hereinafter also referred to as "Structure Ctm135") is described in the following.

Figure 8:
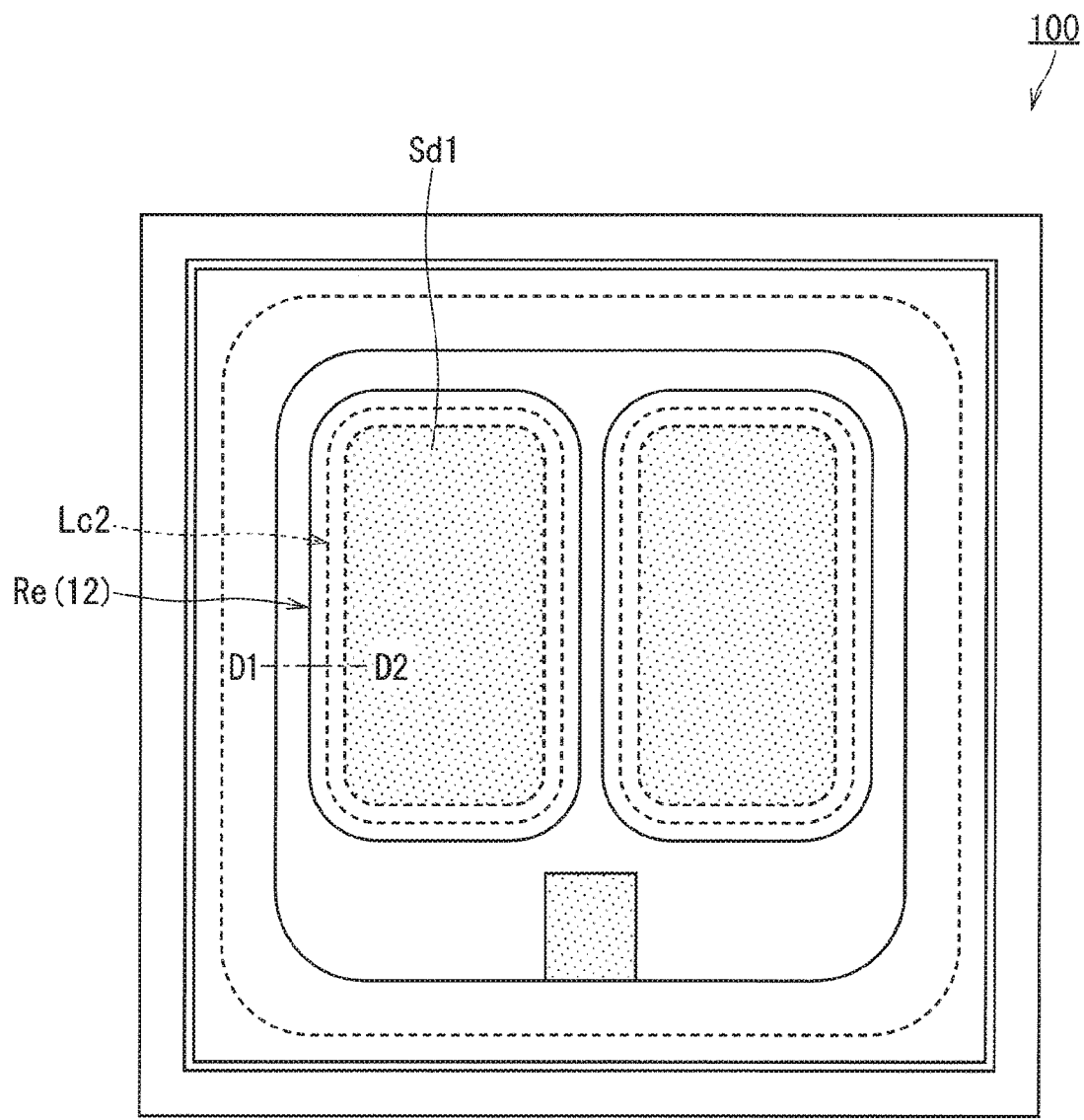
FIG. 8 is a plan view of a power device having the structure according to a fifth variation of the present invention.
Figure 9:
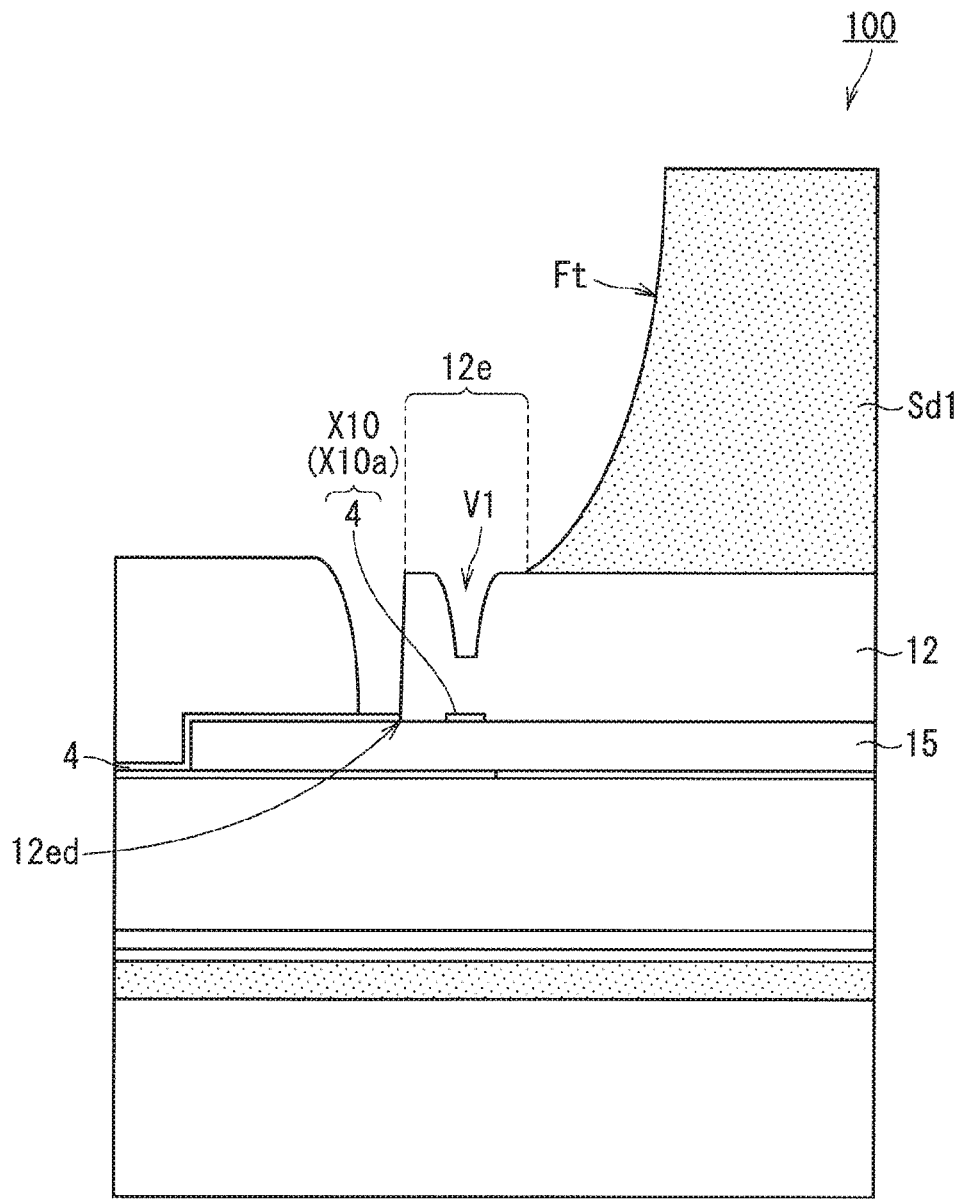
FIG. 9 is a section view of part of a power device having the structure according to the fifth variation of the present invention.

FIG. 8 is a plan view of the power device 100 having Structure Ctm135 according to the fifth variation of the present invention. FIG. 9 is a section view of part of the power device 100 having Structure Ctm135 according to the fifth variation of the present invention taken along line D1-D2 in FIG. 8. Structure Ctm135 is obtained by applying Structure Ctm5 to the structure shown in FIG. 6. As shown in FIG. 9, in the end 12e of the metal layer 12, the recess V1 is formed at a region above the insulating member X10.

The shape of the recess V1 as seen in a plan view (XY plane) is ring-like (closed loop-like), Specifically, the recess V1 is formed at the end 12e of the metal layer 12 so that the solder layer Sd1 is provided on the inner side of the ring-like (closed loop-like) recess V1.

Note that, FIGS. 8 and 9 show the state where the insulating member X10 is structured by one glass coat film 4. FIG. 8 shows the disposition position of the insulating member X10 (the glass coat film 4) by broken line Lc2.

Further, as an example, the glass coat film 4 (the insulating film) is structured by an oxide film. That is, the insulating member X10a structured by one glass coat film 4 is structured by an oxide film.

Note that, as an example, the glass coat film 4 (the insulating film) may be structured by a nitride film. In this case, the insulating member X10a structured by one glass coat film 4 is structured by a nitride film.

In Structure Ctm135, as seen in a plan view (XY plane), the insulating member X10 is provided along the rim part of the solder layer Sd1. The shape of the glass coat film 4 (the insulating film) is ring-like. Note that, the width of the ring-like glass coat film 4 is set to a proper size so that the recess V1 becomes closed loop-like (ring-like).

Note that, similarly to FIG. 3, the insulating member X10 may be structured by a plurality of glass coat films 4. That is, the insulating member X10 may be structured by a plurality of glass coat films 4 (the insulating films) being different from each other in size. In this case, the shape of each of the plurality of glass coat films 4 (the insulating films) is ring-like.

Further, in Structure Ctm135, the shape of the solder layer Sd1 on its side surface side is fillet-shaped. That is, the fillet Ft is formed at the side surface of the solder layer Sd1.

Note that, since the method for manufacturing Structure Ctm5 is similar to that in the first and second variations, a description thereof is omitted. However, when the width of the ring-like glass coat film 4 is extremely narrow, the recess V1 being great in size is not formed at the end 12e of the metal layer 12. Further, when the width of the glass coat film 4 is extremely great, the pattern is separated. Accordingly, the width of the glass coat film 4 is set to a proper size taking into consideration of the thickness of the metal layer 12.

As has been described above, the present variation exhibits the effect identical to that exhibited by the first preferred embodiment. Further, Structure Ctm135 exhibits the effect identical to that exhibited by the third variation.

Further, in Structure Ctm5, by virtue of the recess V1 existing at the end 12e of the metal layer 12, in joining a semiconductor device (a chip) to the solder layer Sd1, the flowing solder is prevented from reaching the edge (the edge 12ed) of the metal layer 12.

This reduces force applied to the metal layer 15 by the edge 12ed of the metal layer 12. Accordingly, the chances of occurrence of a breakage (a crack) at the substrate 7 are minimized.

Further, by changing the number and width of the recess, the solder is effectively prevented from reaching the edge (edge 12ed) of the metal layer 12.

Sixth Variation

Hereinafter, the structure of the present variation is also referred to as "Structure Ctm6". In Structure Ctm6, the thickness of the insulating member X10 is smaller than the thickness of the metal layer 12. Further, the thickness of the end 12e of the metal layer 12 becomes gradually smaller toward the edge (edge 12ed) of the end 12e. Still further, in Structure Ctm6, in the insulating member X10, the insulating member X10 is structured so that a portion in the insulating member X10 nearer to the edge (edge 12ed) of the metal layer 12 is higher in density.

Structure Ctm6 is applied to all or part of Structure CU (the first preferred embodiment), Structure Ctm1 (the first variation), Structure Ctm2 (the second variation), Structure Ctm3 (the third variation), Structure Ctm4 (the fourth variation), and Structure Ctm5 (the fifth variation).

As an example, Structure Ctm1, Ctm3, Ctm5 to which Structure Ctm6 is applied (hereinafter also referred to as "Structure Ctm1356") is described in the following. Structure Ctm1356 is obtained by applying Structure Ctm6 to the structure shown in FIG. 9.

Figure 10:
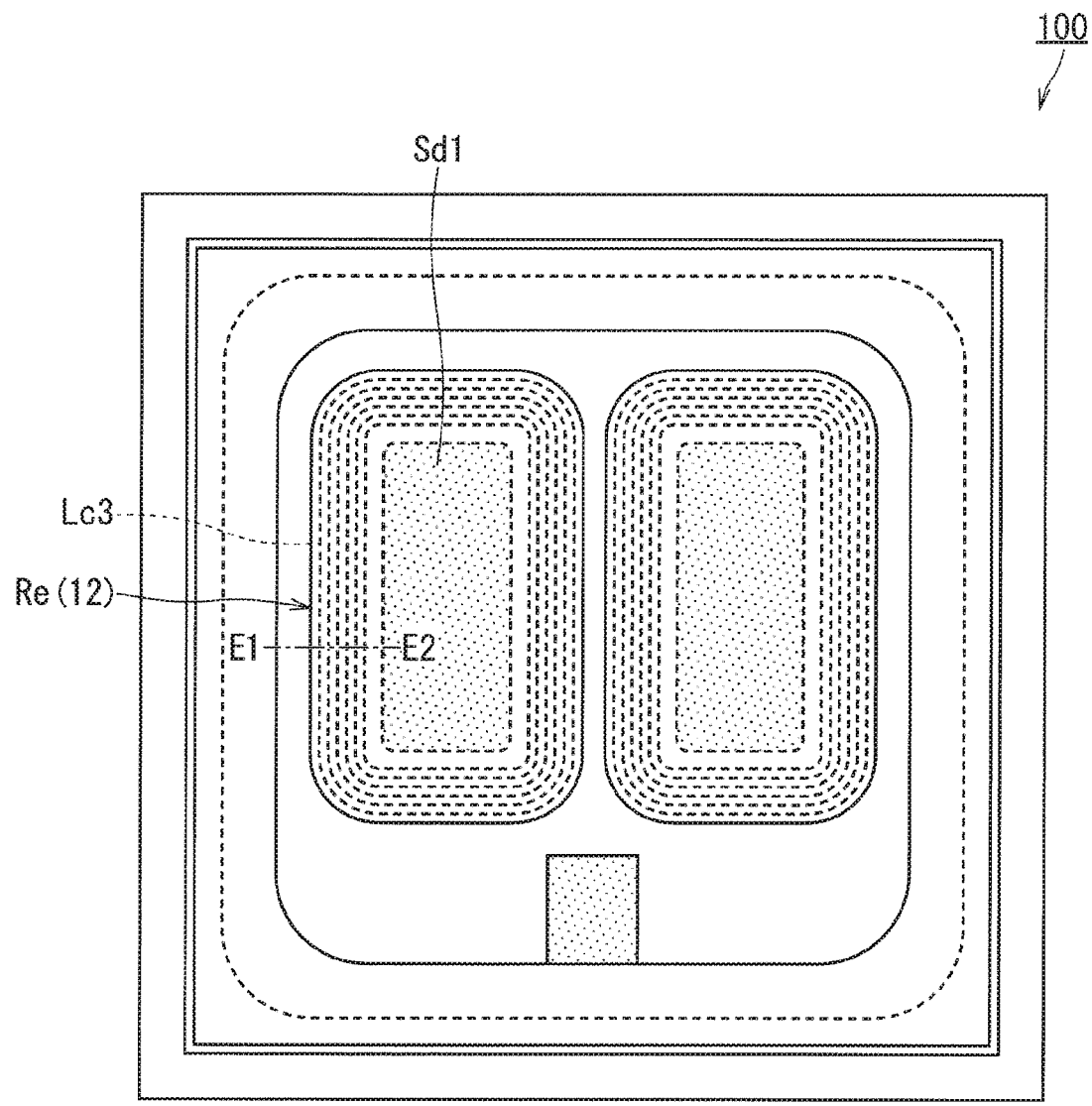
FIG. 10 is a plan view of a power device having the structure according to a sixth variation of the present invention.

FIG. 10 is a plan view of the power device 100 having Structure Ctm1356 according to the sixth variation of the present invention. FIG. 11 is a section view of part of the power device 100 having Structure Ctm1356 according to the sixth variation taken along line E1-E2 in FIG. 10. As shown in FIG. 11, in Structure Ctm1356, in the end 12e of the metal layer 12, the recess V1 is formed at a region above the insulating member X10.

Further, as shown in FIGS. 10 and 11, as seen in a plan (XY plane), the insulating member X10 is provided along the rim part of the solder layer Sd1. The insulating member X10 is structured by a plurality of glass coat films 4 (insulating films) being different from each other in size.

As an example, the insulating member X10 is structured by three glass coat films 4 (the insulating films). FIG. 10 shows the contours of the three glass coat films 4 (the insulating films) by broken lines Lc3. The shape of each of the plurality of glass coat films 4 (the insulating films) is ring-like.

Further, the width of the plurality of glass coat films 4 (insulating films) is set so that the thickness of the end 12e of the metal layer 12 becomes gradually smaller toward the edge 12ed. Specifically, a greater width of the plurality of glass coat films 4 (the insulating films) is set as the glass coat films 4 are nearer to the edge 12ed. That is, the insulating member X10 is structured so that, in the insulating member X10, a portion nearer to the edge (edge 12ed) of the metal layer 12 is higher in density. Thus, the thickness of the end 12e of the metal layer 12 becomes gradually smaller toward the edge (edge 12ed) of the end 12e.

Further, in Structure Ctm1356, the shape of the solder layer Sd1 on its side surface side is fillet-shaped. That is, the fillet Ft is formed at the side surface of the solder layer Sd1.

The method for manufacturing Structure Ctm6 is realized just by patterning the glass coat films 4 and, therefore, the description of the manufacturing method is omitted. Basically, Structure Ctm6 is manufactured so that the plurality of glass coat films 4 have a greater width as the glass coat films 4 are nearer to the edge 12ed.

As has been described above, the present variation exhibits the effect identical to that exhibited by the first preferred embodiment. Further, the thickness of the end 12e of the metal layer 12 becomes gradually smaller toward the edge (the edge 12ed) of the end 12e. Accordingly, the edge 12ed of the metal layer 12 reduces force applied to the metal layer 15. Accordingly, the chances of occurrence of a breakage (a crack) at the substrate 7 are minimized.

Further, Structure Ctm1356 exhibits the effect similar to that exhibited by the third and fifth variations. Accordingly, the heat cycle resistance of the power device 100 improves. As a result, the product life of the power device 100 increases.

Seventh Variation

Hereinafter, the structure of the present variation is also referred to as "Structure Ctm7". Structure Ctm7 is obtained by applying Structure Ctm4 to Structure Ctm6. In Structure Ctm7, the insulating member X10 is provided on the Ti layer 5. That is, in Structure Ctm4, the Ti layer 5 exists under the insulating member X10.

Structure Ctm7 is applied to all or part of Structure Ct1 (the first preferred embodiment), Structure Ctm1 (the first variation), Structure Ctm2 (the second variation), Structure Ctm3 (the third variation), and Structure Ctm5 (the fifth variation).

As an example, Structure Ctm1, Ctm3, Ctm5, Ctm6 to which Structure Ctm7 is applied (hereinafter also referred to as "Structure Ctm13567") is described in the following. Structure Ctm13567 is obtained by applying Structure Ctm7 (Structure Ctm4, Ctm6) to the structure shown in FIG. 11.

Figure 12:
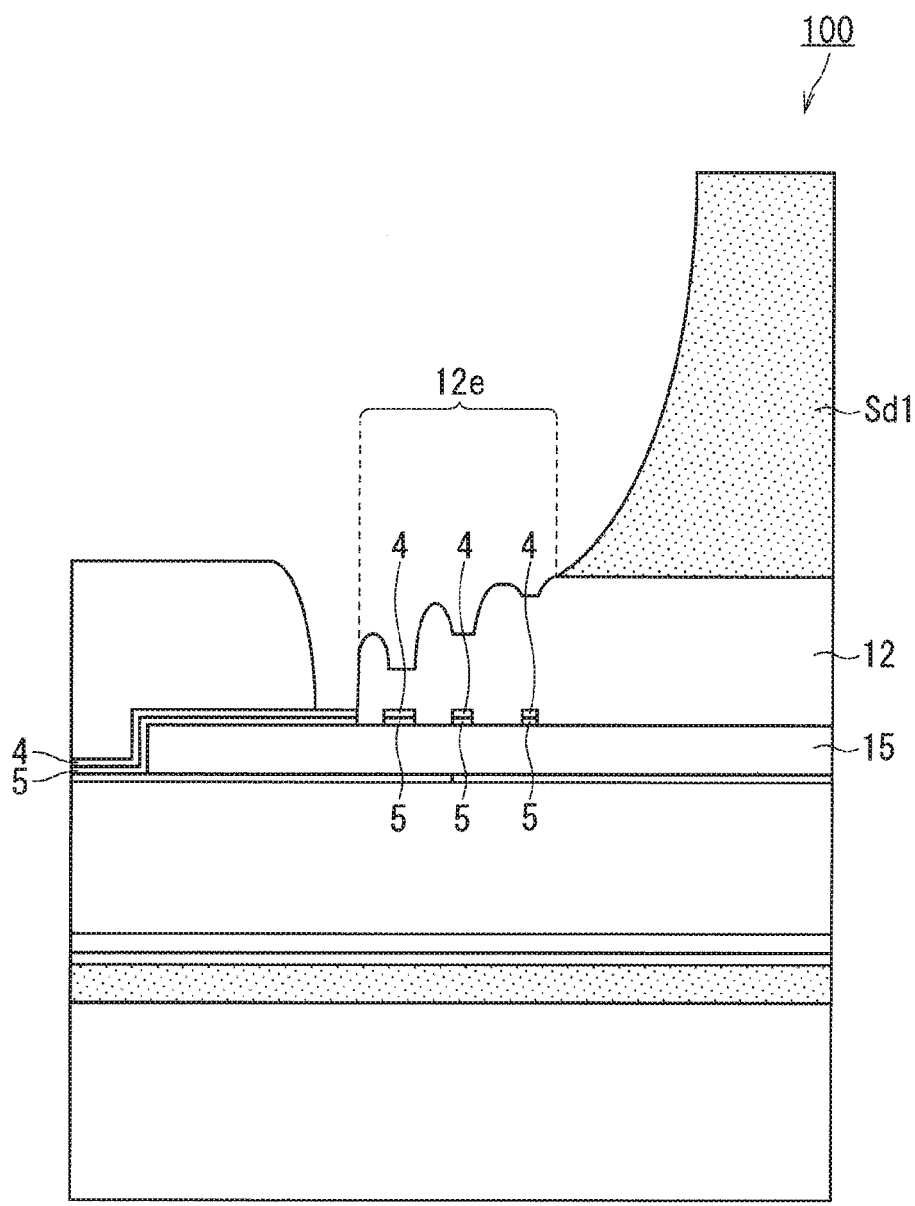
FIG. 12 is a section view of part of a power device having the structure according to a seventh variation of the present invention.

FIG. 10 is a plan view of the power device 100 having Structure Ctm13567. FIG. 12 is a section view of part of the power device 100 having Structure Ctm13567 taken along line E1-E2 shown in FIG. 10. As shown in FIG. 12, the insulating member X10 is provided on the Ti layer 5. That is, the Ti layer 5 exists under each of the glass coat films 4 (the insulating films) structuring the insulating member X10.

As has been described above, the present variation exhibits the effect identical to that exhibited by the first preferred embodiment. Further, Structure Ctm13567 exhibits the effect exhibited by the fourth variation (Structure Ctm4) and the effect exhibited by the sixth variation (Ctm6).

Eighth Variation

Hereinafter, the structure of the present variation is also referred to as "Structure Ctm8". Structure Ctm8 is obtained by applying Structure Ctm2 to Structure Ctm6.

Structure Ctm8 is applied to all or part of Structure Ct1 (the first preferred embodiment), Structure Ctm1 (the first variation), Structure Ctm3 (the third variation), Structure Ctm4 (the fourth variation), and Structure Ctm5 (the fifth variation). As an example, Structure Ctm1, Ctm3, Ctm5 to which Structure Ctm8 is applied (hereinafter also referred to as "Structure Ctm1358") is described in the following. Structure Ctm1358 is obtained by applying Structure Ctm8 (Structure Ctm2) to the structure shown in FIGS. 10 and 11.

Figure 13:
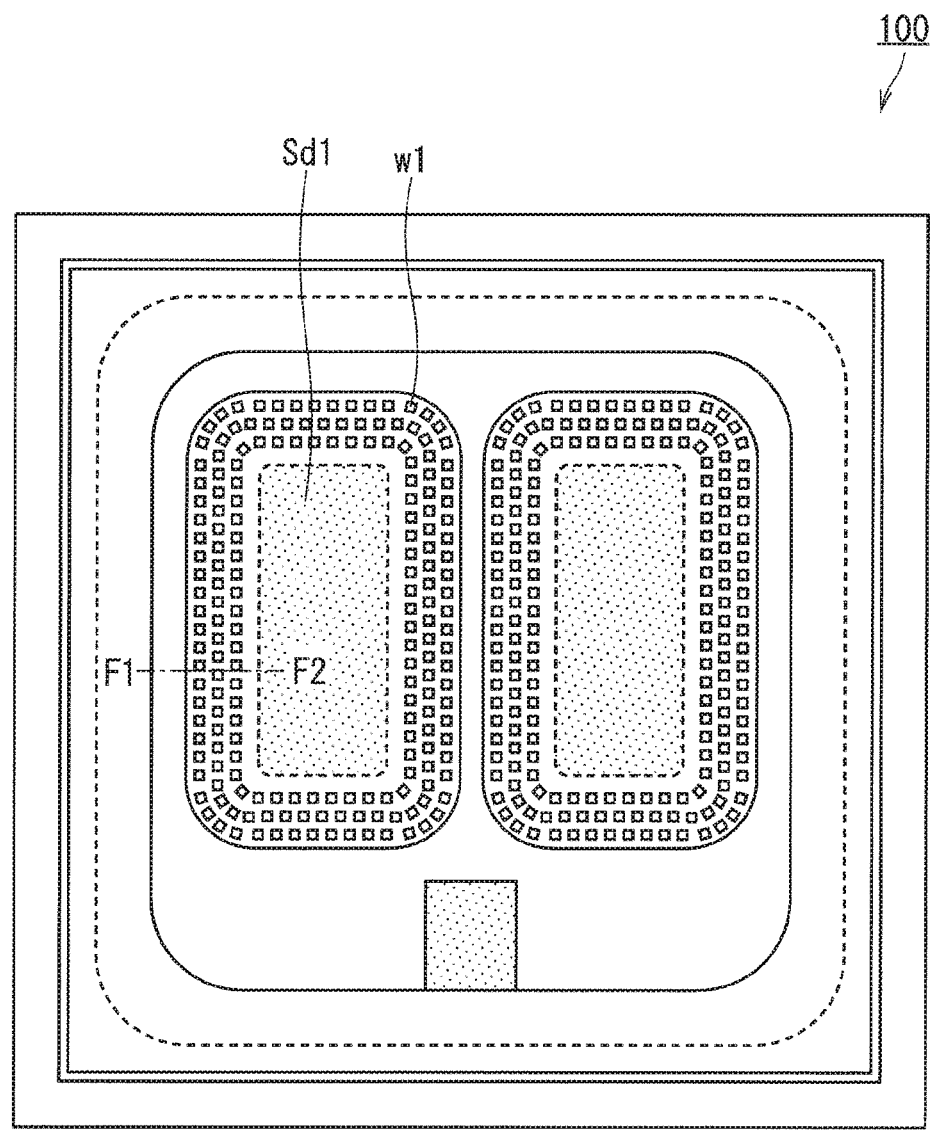
FIG. 13 is a plan view of a power device having the structure according to an eighth variation of the present invention.

FIG. 13 is a plan view of the power device 100 having Structure Ctm1358 according to the eighth variation of the present invention. Note that, FIG. 11 is a section view of part of the power device 100 having Structure Ctm1358 taken along line F1-F2 in FIG. 13.

As shown in FIG. 13, in Structure Ctm1358, the insulating member X10 is structured by a plurality of insulating parts w1 disposed dot-like (point-like). Specifically, in Structure Ctm13568, each of the plurality of glass coat films 4 (the insulating films) structuring the insulating member X10 is structured by a plurality of insulating parts w1 disposed dot-like (point-like).

As has been described above, the present variation exhibits the effect identical to that exhibited by the first preferred embodiment. Further, Structure Ctm1358 exhibits the effect exhibited by the second variation.

Ninth Variation

Hereinafter, the structure of the present variation is also referred to as "Structure Ctm9". In Structure Ctm9, the metal layer 15 is structured by a plurality of layers (members) different from each other in hardness. Hereinafter, the metal layer 15 structured by the plurality of layers (members) different from each other in hardness is also referred to as the "metal layer 15A".

Structure Ctm9 is applied to all or part of Structure Ct1, Structure Ctm1, Structure Ctm2, Structure Ctm3, Structure Ctm4, Structure Ctm5, Structure Ctm6, Structure Ctm7, and Structure Ctm8.

Figure 14:
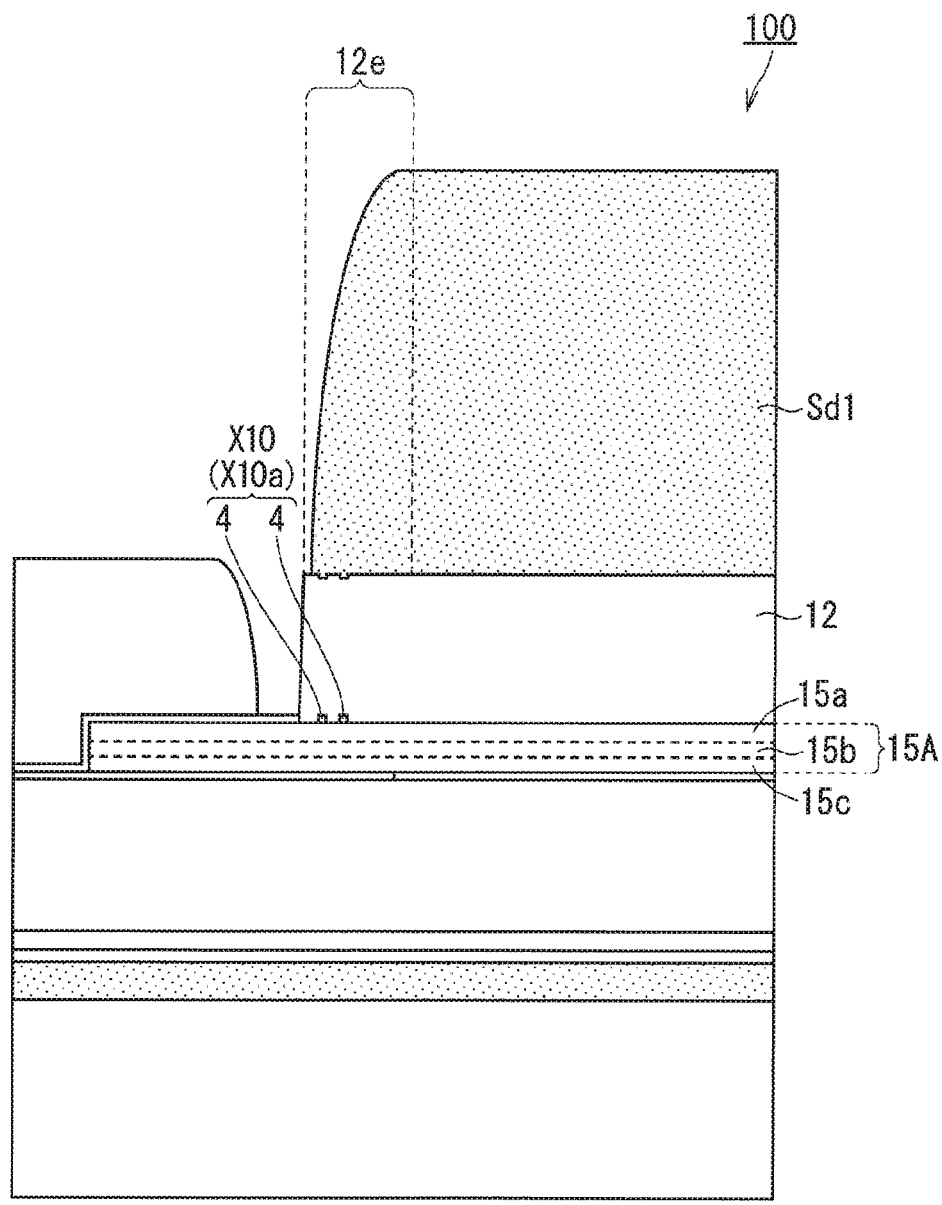
FIG. 14 is a section view of part of a power device having the structure according to a ninth variation of the present invention.

As an example, Structure Ctm1 to which Structure Ctm9 is applied (hereinafter also referred to as the "Structure Ctm19") is described in the following. FIG. 1 is a plan view of the power device 100 having Structure Ctm19 according to the ninth variation. FIG. 14 is a section view of part of the power device 100 having Structure Ctm19 taken along line A1-A2 in FIG. 1.

With reference to FIG. 14, the metal layer 15A includes a layer 15b, a layer 15a, and a layer 15c. Each of the layers 15a, 15b, 15c is made of, for example, aluminum alloy (AlSi). The hardness of the layer 15b is higher than the hardness of the layers 15a, 15c. That is, the hardness of the layers 15a, 15c is lower than the hardness of the layer 15b.

The layer 15b is provided on the layer 15e. The layer 15a is provided on the layer 15b. That is, the layer 15b is interposed between the layers 15a, 15c. The layer 15a is in contact with the metal layer 12. That is, the layer 15b is not in contact with the metal layer 12.

The method for manufacturing the metal layer 15A is carried out as follows. The layers 15a, 15b, 15c are formed so that the grain size of the layers 15a, 15e becomes greater than the grain size of the layer 15b.

Specifically, the layers 15a, 15b, 15c are formed by sputtering. Firstly, the layer 15c is formed at increased sputtering power. Next, the layer 15b is formed at reduced sputtering power. Next, by the method identical to that for forming the layer 15c, the layer 15a is formed.

As has been described above, the present variation exhibits the effect identical to that exhibited by the first preferred embodiment. Further, Structure Ctm19 exhibits the effect exhibited by the first variation. Still further, in Structure Ctm9 included in Structure Ctm19, the layer 15a is in contact with the metal layer 12. That is, the layer 15b higher in hardness than the layer 15a is not in contact with the metal layer 12. Accordingly, provided that a crack has occurred at the layer 15a of the metal layer 15A, the presence of the layer 15b minimizes the chances of the crack reaching the substrate 7. Accordingly, this further minimizes the chances of occurrence of a breakage (a crack) at the substrate 7.

Further, the present variation can reduce adhesion between the end 12e of the metal layer 12 and the metal layer 15A. Accordingly, occurrence of a separating portion (a crack) between the end 12e and the metal layer 15A is facilitated, whereby the chances of occurrence of a breakage (a crack) at the substrate 7 are minimized.

Note that, in the present invention, within the scope of the invention, the embodiments and the variations can be freely combined, modified or omitted as appropriate.

For example, the present invention is applicable to a power device irrespective of the breakdown voltage class of the power device, the type of the substrate (an FZ substrate, an epitaxial substrate) and the like.

Note that, the material for reducing adhesion between the metal layer 12 and the metal layer 15 is not limited to an oxide film, a nitride film, and Ti, and may be other material.

Note that, while the metal layers 22, 25 are provided on the main surface 7b side of the substrate 7, a material not easily oxidized (Au) may be formed at the surface (the lower surface) of the metal layer 22. This contributes also to improving stability of assembly of the power device.

While the invention has been shown and described in detail, the foregoing description is in all aspects illustrative and not restrictive. It is therefore understood that numerous modifications and variations can be devised without departing from the scope of the invention.

What is claimed is:

1. A power device provided with a first main electrode on one main surface side of a substrate, and a second main electrode on other main surface side of the substrate, the power device comprising:
    a first metal layer provided on the one main surface side of the substrate and electrically connected to the one main surface; and
    a second metal layer formed on the first metal layer, wherein
    the first main electrode includes the first metal layer and the second metal layer, and
    a solder layer is provided on the second metal layer, the power device further comprising
    an insulating member surrounded by a first end of the first metal layer and a second end of the second metal layer, the second end opposing to the first end, wherein
    the insulating member is structured so that the first end of the first metal layer is partially connected to the second end of the second metal layer, and
    the insulating member is solid.

2. The power device according to claim 1, wherein, in the second end of the second metal layer, a recess is formed at a region above the insulating member.

3. The power device according to claim 1, wherein
    the insulating member is smaller in thickness than the second metal layer, and
    a thickness of the second end of the second metal layer becomes gradually smaller toward an edge of the second end.

4. The power device according to claim 1, wherein, as seen in a plan view, the insulating member is provided along a rim part of the solder layer.

5. The power device according to claim 4, wherein
    the insulating member is structured by a plurality of insulating films being different from each other in size, and
    a shape of each of the plurality of insulating films is ring-like.

6. The power device according to claim 4, wherein the insulating member is structured by a plurality of insulating parts disposed dot-like.

7. The power device according to claim 1, wherein the insulating member is structured so that a portion in the insulating member nearer to the edge of the second metal layer is higher in density.

8. The power device according to claim 1, wherein the insulating member is structured by an oxide film.

9. The power device according to claim 1, wherein the insulating member is structured by a nitride film.

10. The power device according to claim 8, further comprising a Ti layer, wherein the insulating member is provided on the Ti layer.

11. The power device according to claim 1, wherein a shape of the solder layer on its side surface side is fillet-shaped.

12. The power device according to claim 1, wherein
    the first metal layer includes a first layer and a second layer provided on the first layer,
    the second layer is lower in hardness than the first layer, and
    the second layer is in contact with the second metal layer.

* * * * *